(12) United States Patent
Iga et al.

(10) Patent No.: US 12,311,470 B2
(45) Date of Patent: May 27, 2025

(54) METHOD OF PROCESSING MONOCRYSTALLINE SILICON WAFER

(71) Applicant: DISCO CORPORATION, Tokyo (JP)

(72) Inventors: Hayato Iga, Tokyo (JP); Kazuya Hirata, Tokyo (JP); Shunichiro Hirosawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 504 days.

(21) Appl. No.: 17/821,556

(22) Filed: Aug. 23, 2022

(65) Prior Publication Data

US 2023/0066601 A1 Mar. 2, 2023

(30) Foreign Application Priority Data

Aug. 30, 2021 (JP) ................. 2021-140404

(51) Int. Cl.
| | | |
|---|---|---|
| *B23K 26/53* | (2014.01) | |
| *B23K 26/00* | (2014.01) | |
| *B23K 26/03* | (2006.01) | |
| *B23K 101/40* | (2006.01) | |
| *B23K 103/00* | (2006.01) | |
| *H01L 21/78* | (2006.01) | |

(52) U.S. Cl.
CPC .......... *B23K 26/53* (2015.10); *B23K 26/0006* (2013.01); *B23K 26/032* (2013.01); *H01L 21/78* (2013.01); *B23K 2101/40* (2018.08); *B23K 2103/56* (2018.08)

(58) Field of Classification Search
CPC .. B23K 26/53; B23K 26/0006; B23K 26/032; B23K 2101/40; B23K 2103/56; B23K 26/0676; B23K 26/0622; B23K 26/0853; B23K 26/08; H01L 21/78; H01L 21/304; H01L 21/185
See application file for complete search history.

(56) References Cited

U.S. PATENT DOCUMENTS

| | | | |
|---|---|---|---|
| 11,056,346 B2 * | 7/2021 | Sandoh | H01L 21/78 |
| 2017/0294300 A1 * | 10/2017 | Kozai | H01L 21/67259 |
| 2018/0068895 A1 * | 3/2018 | Sandoh | H01L 21/3065 |
| 2020/0168451 A1 * | 5/2020 | Lu | H01L 21/02013 |
| 2021/0316476 A1 * | 10/2021 | Nomaru | B23K 26/0622 |

FOREIGN PATENT DOCUMENTS

| | | |
|---|---|---|
| JP | 2007158239 A | 6/2007 |
| JP | 2020136442 A | 8/2020 |

\* cited by examiner

*Primary Examiner* — Thanh T Nguyen
(74) *Attorney, Agent, or Firm* — Greer Burns & Crain Ltd.

(57) ABSTRACT

A monocrystalline silicon wafer fabricated such that a particular crystal plane, e.g., a crystal plane (100), included in crystal planes {100} is exposed on each of face and reverse sides of the monocrystalline silicon wafer is irradiated with a laser beam along a first direction parallel to the particular crystal plane and inclined to a particular crystal orientation, e.g., a crystal orientation [010], included in crystal orientations <100> at an angle of 5° or less, thereby forming a peel-off layer that functions as separation initiating points between a part of the monocrystalline silicon wafer that belongs to the face side thereof and a part of the monocrystalline silicon wafer that belongs to the reverse side thereof.

5 Claims, 15 Drawing Sheets

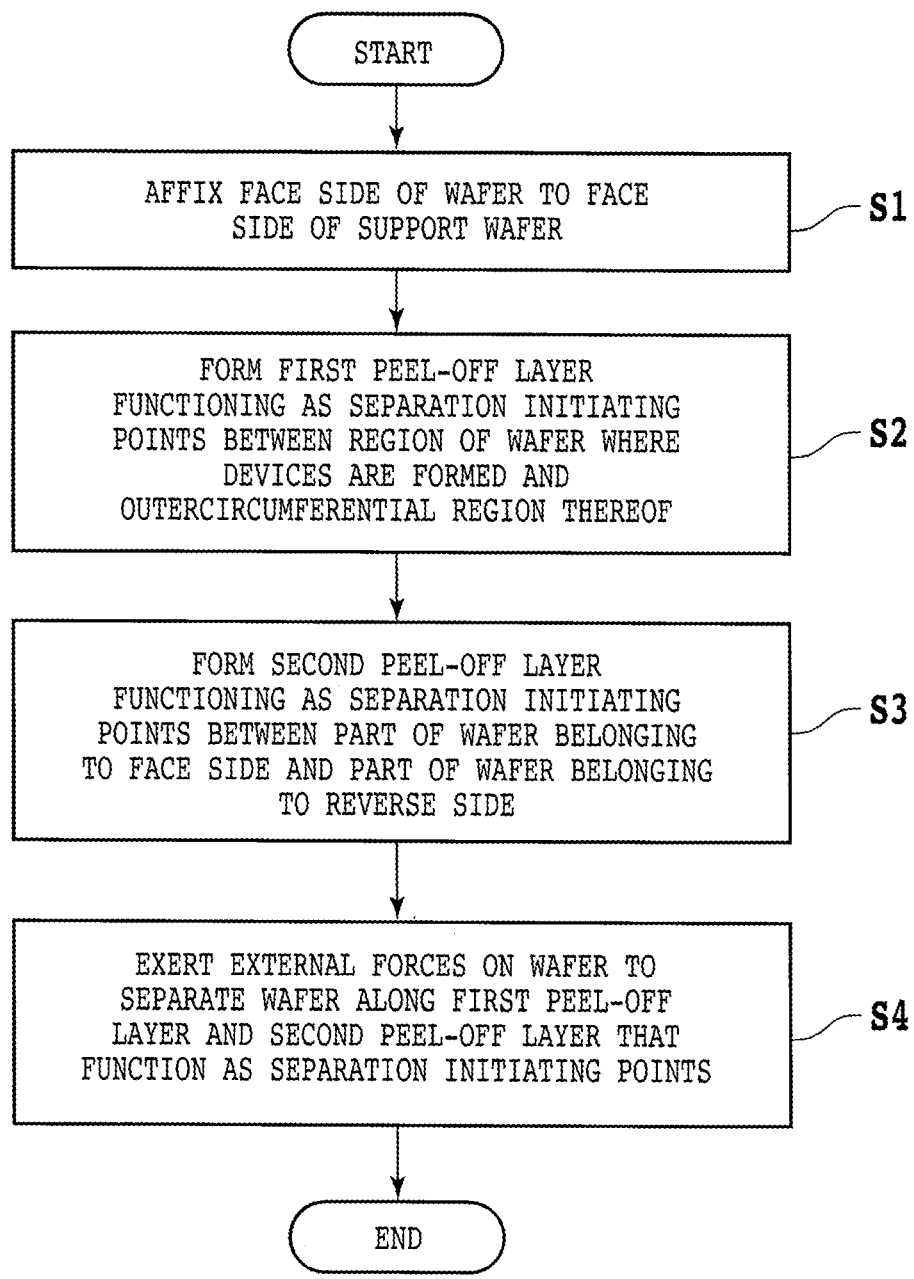

METHOD OF PROCESSING MONOCRYSTALLINE SILICON WAFER

BACKGROUND OF THE INVENTION

Field of the Invention

The present invention relates to a method of processing a monocrystalline silicon wafer by forming peel-off layers in the monocrystalline silicon wafer and then separating the monocrystalline silicon wafer along the peel-off layers that function as separation initiating points.

Description of the Related Art

Chips of semiconductor devices (hereinafter simply referred to as "devices") are generally manufactured from a disk-shaped monocrystalline silicon wafer (hereinafter simply referred to as a "wafer"). Specifically, the wafer has a plurality of areas demarcated by a grid of projected dicing lines, and devices are formed respectively in face sides of the areas of the wafer. The wafer is divided into device chips along the projected dicing lines.

Some wafers have through-silicon vias (TSVs) for a purpose of producing highly integrated packages including a plurality of chips. Such packages allow electrodes included in different chips to be electrically interconnected through TSVs, for example.

A TSV is formed in a wafer according to the following sequence of steps. First, a groove is formed in a face side of a wafer. Then, a TSV is provided in the groove. Then, the face side of the wafer is affixed to a support wafer. Then, a reverse side of the wafer is ground until the TSV is exposed on the reverse side.

A wafer often has its outer circumferential region beveled for the purpose of preventing itself from chipping. When the reverse side of the wafer with the beveled outer circumferential region is ground until the thickness of the wafer is reduced to half or less, the reverse side of the outer circumferential region is shaped into something like a knife edge.

While the reverses side of the wafer is being ground in this manner, stresses tend to concentrate on the reverse side of the outer circumferential region, making the wafer likely to crack. As a result, a yield of chips from the wafer is liable to decrease. To avoid such problems, it has been proposed in the art to remove part of the face side of the outer circumferential region of the wafer, i.e., to perform generally-called edge trimming, before the reverse side of the wafer is ground (see, for example, JP 2007-158239A).

At a time the remainder of the reverse side of the wafer has been ground, the wafer has its outer circumferential side surface extending generally perpendicularly to the face and reverse sides of the wafer. Consequently, no stress concentration occurs on the reverse side of the outer circumferential region during the grinding of the wafer, making the wafer less likely to crack. As a consequence, the yield of chips from the wafer is prevented from decreasing.

However, in a case where the reverse side of the wafer is ground until TSVs are exposed on the reverse side of the wafer after the edge trimming, an amount of material ground off the wafer is large, and hence grindstones that are used to grind the wafer are worn to a large extent. Accordingly, chips or packages fabricated from the wafer are likely to become costly, and the processing of the wafer is apt to be prolonged.

In view of the foregoing shortcomings, it has been proposed in the art to divide a wafer with a laser beam having a wavelength transmittable through the wafer (see, for example, JP 2020-136442A). According to the proposed process, the laser beam is applied to the wafer to form peel-off layers in the wafer while the focused spot of the laser beam is being positioned in the wafer, and the wafer is separated along the peel-off layers that function as separation initiating points.

According to the process, the laser beam is applied to an annular first region of the wafer that causes no irregular reflection of the laser beam, i.e., an annular region positioned radially inwardly of the beveled outer circumferential region. The applied laser beam forms in the wafer a peel-off layer that functions as separation initiating points, i.e., a hollow cylindrical peel-off layer, extending between a region of the wafer where devices are formed and the outer circumferential region of the wafer.

Then, the laser beam is applied again to a second region of the wafer that causes no irregular reflection of the laser beam, i.e., a circular region that is positioned radially inwardly of the beveled outer circumferential region. The applied laser beam forms a peel-off layer that functions as separation initiating points extending between the face and reverse sides of the wafer, i.e., a disk-shaped peel-off layer.

Then, external forces are exerted on the wafer to separate the wafer along the hollow cylindrical peel-off layer and the disk-shaped peel-off layer. In other words, the outer circumferential region of the wafer is separated from the region of the wafer where devices are formed, and the reverse side of the wafer is separated from the face side thereof.

In a case where the wafer is divided in the manner described above, the amount of material ground off the reverse side of the wafer until TSVs are exposed is reduced, and grindstones that are used to grind the wafer are worn to a reduced extent. Consequently, chips or packages fabricated from the wafer are prevented from becoming costly, and the processing of the wafer is prevented from being prolonged.

SUMMARY OF THE INVENTION

The peel-off layers referred to above include a modified region where the crystal structure of monocrystalline silicon of the wafer is disrupted and cracks extending from the modified region. Specifically, when the laser beam is applied to the wafer, a modified region is formed in the wafer around the focused spot of the laser beam. Cracks extend from the modified region along certain crystal planes of monocrystalline silicon of the wafer.

Generally, monocrystalline silicon is likely to cleave along a particular crystal plane included in crystal planes {111}. For example, when a laser beam is applied to a wafer that is fabricated such that a particular crystal plane, e.g., crystal plane (100), included in crystal planes {100} is exposed on each of face and reverse sides of the wafer, along a crystal orientation, e.g., crystal orientation [011], parallel to the particular crystal plane, of a particular crystal orientation included in crystal orientations <110>, many cracks are developed from a modified region along a particular crystal plane, e.g., crystal plane (111), included in crystal planes {111}.

An acute angle formed between a particular crystal plane, e.g., crystal plane (100), included in crystal planes {100} and a particular crystal plane, e.g., crystal plane (111), included in crystal planes {111} of monocrystalline silicon is approximately 54.7°. Therefore, when the laser beam is applied to the wafer as described above, many cracks are developed from the modified region in a direction inclined at approximately 54.7° to the face side or the reverse side of the wafer.

In other words, if the direction in which the cracks are developed is resolved into a component parallel to the face and reverse sides of the wafer, i.e., a parallel component, and a component perpendicular to the face and reverse sides of the wafer, i.e., a perpendicular component, then the perpendicular component becomes larger than the parallel component. Consequently, when the laser beam is applied to the wafer to form a peel-off layer, i.e., a disk-shaped peel-off layer, as separation initiating points between the face and reverse sides of the wafer, the following problems tend to take place.

Since the parallel component of the direction in which the cracks are developed is relatively small, the interval between adjacent modified regions needs to be reduced in order to connect the adjacent modified regions with the cracks. For reducing the interval between the adjacent modified regions, it is necessary to increase a processing time, i.e., the time in which the laser beam is applied, required to form the disk-shaped peel-off layer.

Furthermore, inasmuch as the perpendicular component of the direction in which the cracks are developed is relatively large, the cracks are liable to develop from the disk-shaped peel-off layer toward the face side of the wafer, possibly breaking devices on the wafer. Though the probability that devices will be damaged may be reduced by forming a disk-shaped peel-off layer at a position sufficiently spaced from the face side of the wafer, this approach leads to an increase in the amount of material ground off the wafer in a subsequent wafer grinding process.

In view of the aforesaid difficulties, it is an object of the present invention to provide a method of processing a monocrystalline silicon wafer to reduce the processing time required to separate the wafer along a peel-off layer that has been formed in the wafer and also to lower the probability that devices on the wafer will be damaged.

In accordance with an aspect of the present invention, there is provided a method of processing a monocrystalline silicon wafer fabricated such that a particular crystal plane included in crystal planes {100} is exposed on each of face and reverse sides of the monocrystalline silicon wafer, having a plurality of devices formed on the face side, and having a beveled outer circumferential region, by applying a laser beam having a wavelength transmittable through the monocrystalline silicon wafer while positioning a focused spot of the laser beam within the monocrystalline silicon wafer, thereby forming a peel-off layer within the monocrystalline silicon wafer, and thereafter separating the monocrystalline silicon wafer along the peel-off layer that functions as separation initiating points. The method includes an affixing step of affixing the face side of the monocrystalline silicon wafer to a face side of a support wafer, a first peel-off layer forming step of applying the laser beam from the reverse side of the monocrystalline silicon wafer to an annular first region of the monocrystalline silicon wafer that is positioned radially inwardly of the outer circumferential region of the monocrystalline silicon wafer, thereby forming a first peel-off layer that functions as separation initiating points between a region of the monocrystalline silicon wafer where the devices are formed and the outer circumferential region thereof, a second peel-off layer forming step of applying the laser beam from the reverse side of the monocrystalline silicon wafer to a second region of the monocrystalline silicon wafer that is positioned radially inwardly of the outer circumferential region of the monocrystalline silicon wafer, thereby forming a second peel-off layer that functions as separation initiating points between a part of the monocrystalline silicon wafer that belongs to the face side thereof and a part of the monocrystalline silicon wafer that belongs to the reverse side thereof, and a separating step of, after the affixing step, the first peel-off layer forming step and the second peel-off layer forming step, exerting external forces on the monocrystalline silicon wafer, thereby separating the monocrystalline silicon wafer along the first peel-off layer and the second peel-off layer as the separation initiating points. The second peel-off layer forming step includes a laser beam applying step of applying the laser beam to a straight region of the monocrystalline silicon wafer along a first direction included in the second region while moving the monocrystalline silicon wafer and the focused spot relatively to each other along the first direction that lies parallel to the particular crystal plane and is inclined to a particular crystal orientation included in crystal orientations <100> at an angle of 5° or less, and an indexing feed step of moving a position in the monocrystalline crystal wafer where the focused spot is formed by the applied laser beam along a second direction parallel to the particular crystal plane and perpendicular to the first direction. The laser beam applying step and the indexing feed step are repeatedly carried out to form the second peel-off layer.

It is preferable that the first peel-off layer forming step be carried out before the second peel-off layer forming step.

It is preferable that the second region be positioned radially inwardly of the first region.

It is preferable that the first peel-off layer forming step include the step of forming the first peel-off layer so as to terminate short of the reverse side of the monocrystalline crystal wafer.

It is preferable that the first peel-off layer forming step include the step of forming the first peel-off layer along a side surface of a truncated cone having a first bottom surface positioned near the face side of the monocrystalline crystal wafer and a second bottom surface smaller in diameter than the first bottom surface and positioned within the monocrystalline crystal wafer, by applying the laser beam such that the focused spot thereof is progressively closer to the face side of the monocrystalline crystal wafer toward the outer circumferential region thereof.

According to the present invention, a monocrystalline silicon wafer fabricated such that a particular crystal plane, e.g., a crystal plane (100), included in crystal planes {100} is exposed on each of face and reverse sides of the monocrystalline silicon wafer is irradiated with a laser beam along a first direction parallel to the particular crystal plane and inclined to a particular crystal orientation, e.g., a crystal orientation [010], included in crystal orientations <100> at an angle of 5° or less, thereby forming a peel-off layer, i.e., a second peel-off layer, that functions as separation initiating points between a part of the monocrystalline silicon wafer that belongs to the face side thereof and a part of the monocrystalline silicon wafer that belongs to the reverse side thereof.

In this case, cracks extending from modified areas include more cracks along a particular crystal plane, e.g., a crystal plane (101), included in crystal planes {n10} (n represents a natural number of 10 or less) than cracks along a particular crystal plane, e.g., a crystal plane (111), included in crystal planes {111}. The acute angle formed between the particular crystal plane included in the crystal planes {100} and the particular crystal plane included in the crystal planes {n10} is 45° or less.

According to the present invention, therefore, a component, parallel to the face and reverse sides of the wafer, of the direction in which the cracks are developed, i.e., a parallel component, is larger and a component of the direction perpendicular to the face and reverse sides of the wafer, i.e., a perpendicular component, is smaller than if a second peel-off layer is formed by irradiating a monocrystalline silicon wafer fabricated such that a particular crystal plane included in crystal planes {100} is exposed on each of face and reverse sides of the monocrystalline silicon wafer with a laser beam along a particular crystal orientation, e.g., a crystal orientation [011], parallel to the particular crystal plane and included in crystal orientations <110>.

According to the present invention, consequently, since the parallel component of the direction in which the cracks are developed is large, the intervals between adjacent modified areas are increased. As a result, the distance that the position in the monocrystalline crystal wafer is moved, i.e., an indexed distance, in the indexing feed step is increased, thereby shortening the processing time, i.e., a period of time in which the laser beam is applied, required to form the peel-off layer that functions as separation initiating points between the face and reverse sides of the wafer.

According to the present invention, moreover, since the perpendicular component of the direction in which the cracks are developed is small, cracks are less likely to be developed from the peel-off layer toward the face side of the wafer. Consequently, the probability that devices will be broken is lowered when the wafer is separated into the part of the wafer belonging to the face side and the part of the wafer belonging to the reverse side.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a flowchart of a sequence of a method of processing a monocrystalline silicon wafer according to an embodiment of the present invention;

DETAILED DESCRIPTION OF THE PREFERRED EMBODIMENT

Figure 1A:
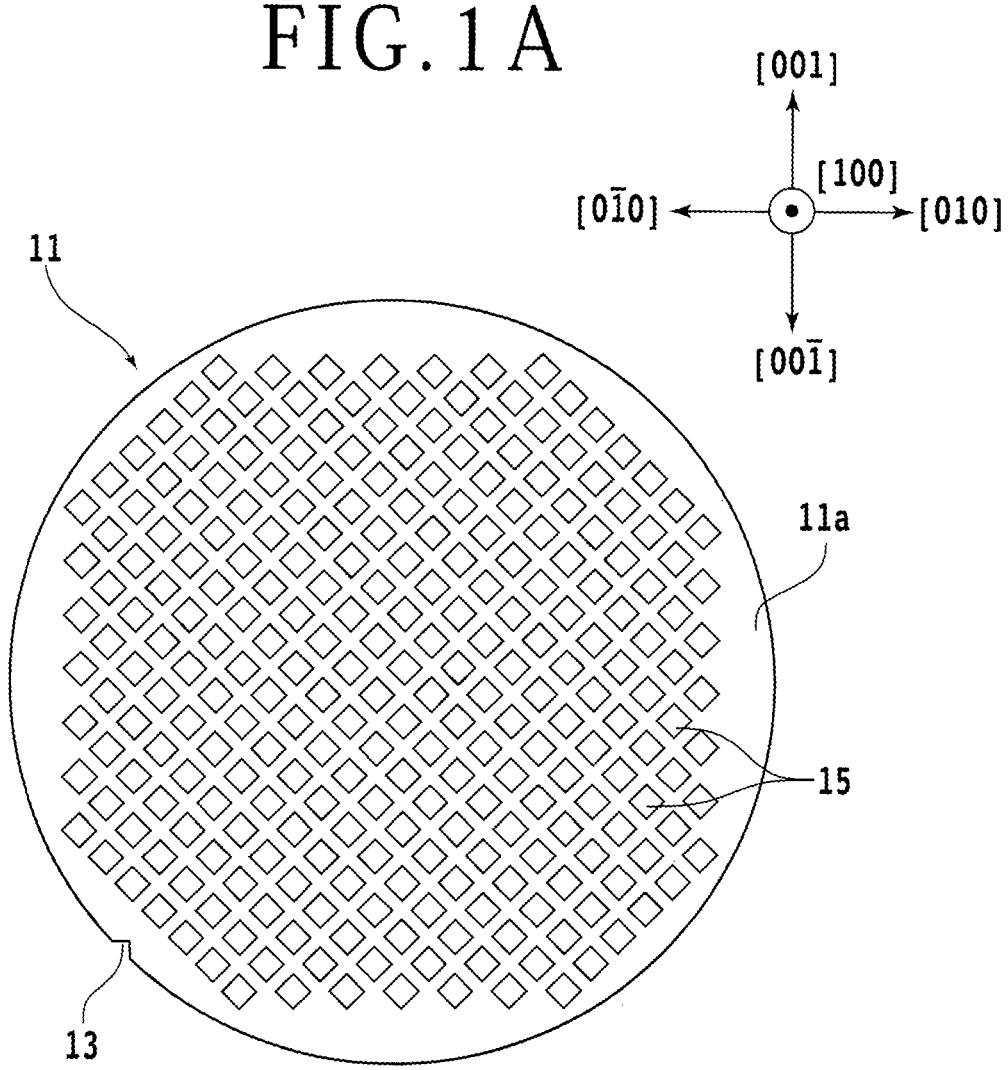
FIG. 1A is a plan view schematically illustrating a wafer by way of example.
Figure 1B:
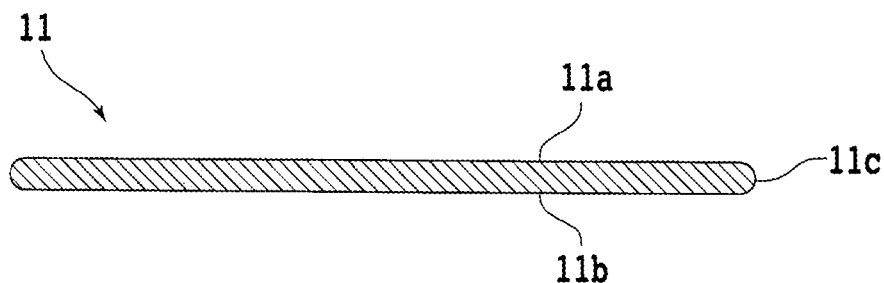
FIG. 1B is a cross-sectional view schematically illustrating the wafer by way of example.

A preferred embodiment of the present invention will be described below with reference to the accompanying drawings. FIG. 1A schematically illustrates, in plan, a wafer, i.e., a monocrystalline silicon wafer, 11 by way of example, and FIG. 1B illustrates, in cross section, the wafer 11 illustrated in FIG. 1A. In FIG. 1A, the crystal orientations of monocrystalline silicon that the wafer 11 is made of are also illustrated.

As illustrated in FIGS. 1A and 1B, the wafer 11 includes a cylinder of monocrystalline silicon where a particular crystal plane, e.g., a crystal plane (100) for the sake of convenience, included in crystal planes {100} is exposed on each of a face side 11*a* and a reverse side 11*b* thereof. In other words, the wafer 11 includes a cylinder of monocrystalline silicon where respective lines normal to the face and reverse sides 11*a* and 11*b*, i.e., a crystal axis, extend along the crystal orientation [100].

Though the wafer 11 is fabricated such that the crystal plane (100) is exposed on each of the face and reverse sides 11*a* and 11*b*, each of the face and reverse sides 11*a* and 11*b* may be slightly inclined to the crystal plane (100) due to processing errors, etc. introduced at the time of the fabrication of the wafer 11. Specifically, an acute angle formed between each of the face and reverse sides 11*a* and 11*b* and the crystal plane (100) may be 1° or less.

In other words, the crystal axis of the wafer 11 may extend along such a direction that an acute angle formed between the direction and the crystal orientation [100] is 1° or less. The wafer 11 has a notch 13 defined in a side surface 11*c* thereof, and the center of the wafer 11 is positioned on a particular crystal orientation, e.g., a crystal orientation [011] for the sake of convenience, included in crystal orientations <110> as viewed from the notch 13.

The wafer 11 includes a plurality of areas demarcated by a plurality of intersecting projected dicing lines. Devices 15 such as integrated circuits (ICs), large-scale-integration (LSI) circuits, semiconductor memories, or complementary-metal-oxide-semiconductor (CMOS) image sensors are formed on the face side 11a in the respective areas.

The face side 11a of the wafer 11 may have grooves defined therein where TSVs are to be provided. The wafer 11 that is disk-shaped, for example, has a beveled outer circumferential region. In other words, the wafer 11 has an outer circumferential side surface 11c that is curved so as to be projected outwardly. The outer circumferential region of the wafer 11 is free of devices 15. A region of the wafer 11 where the devices 15 are formed, i.e., a device region, is disposed radially inwardly of and surrounded by the outer circumferential region.

FIG. 2 is a flowchart of the sequence of a method of processing a monocrystalline silicon wafer according to the present embodiment. According to the method, a laser beam having a wavelength transmittable through the wafer 11 is applied to the wafer 11 while positioning the focused spot of the laser beam within the wafer 11, forming peel-off layers in the wafer 11, and then the wafer 11 is divided along the peel-off layers that function as division initiating points.

Figure 3:
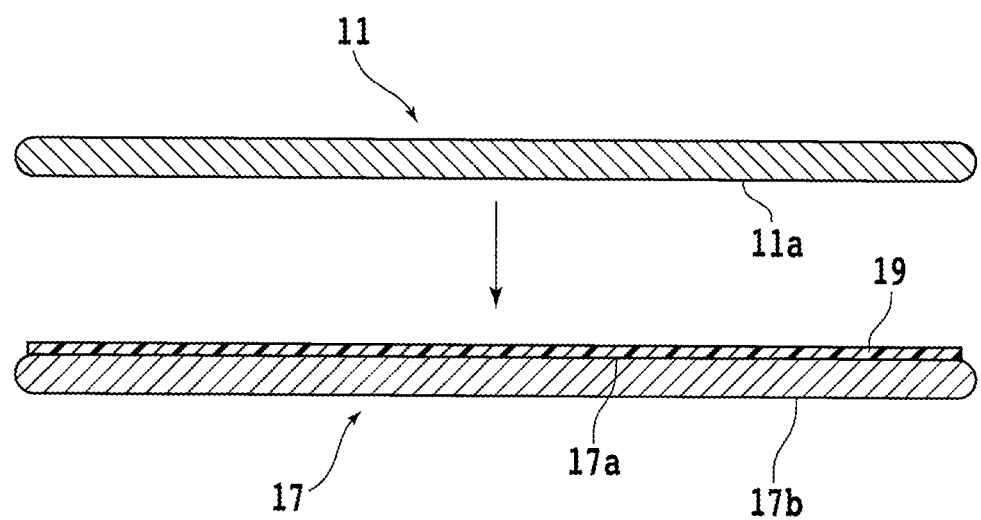
FIG. 3 is a cross-sectional view schematically illustrating a manner in which a face side of the wafer is affixed to a face side of a support wafer.

Specifically, according to the method, the face side 11a of the wafer 11 is affixed to a face side of a support wafer (an affixing step S1 illustrated in FIG. 2). FIG. 3 schematically illustrates, in cross section, the manner in which the face side 11a of the wafer 11 is affixed to the face side, denoted by 17a, of the support wafer, denoted by 17. The support wafer 17 to which the wafer 11 is to be affixed is of the same shape as the wafer 11.

As with the wafer 11, the support wafer 17 may be made of monocrystalline silicon and may have a plurality of devices formed on the face side 17a thereof. An adhesive 19 such as an acryl adhesive or an epoxy adhesive, for example, is disposed on the face side 17a of the support wafer 17.

In the affixing step S1, while a reverse side 17b of the support wafer 17 is being supported, the face side 11a of the wafer 11 is pressed against the face side 17a of the support wafer 17 through the adhesive 19 interposed therebetween. The face side 11a of the wafer 11 is thus affixed to the face side 17a of the support wafer 17, making up a laminated wafer.

Figure 4:
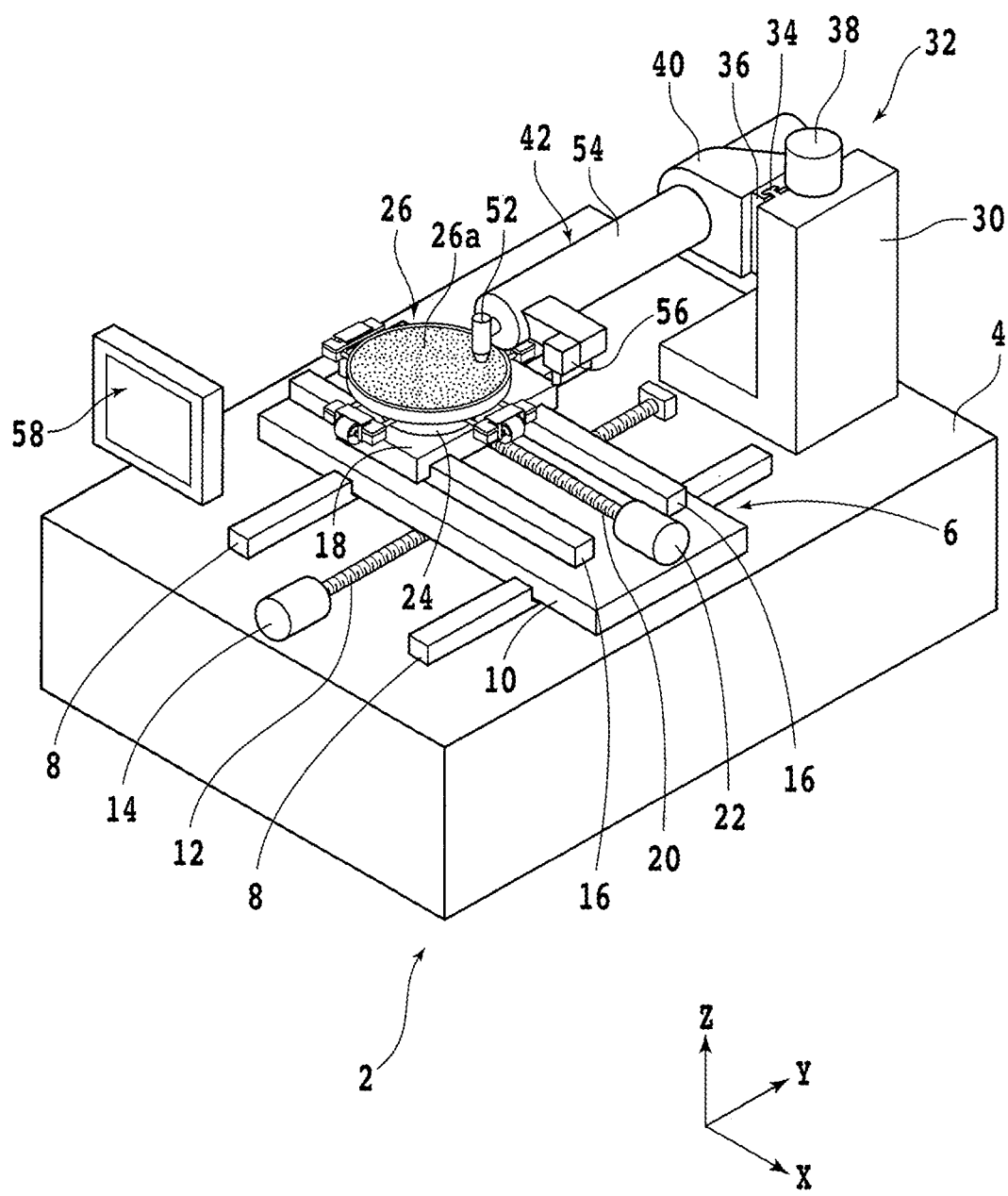
FIG. 4 is a perspective view schematically illustrating a laser processing apparatus by way of example.

Then, peel-off layers are formed in the wafer 11 by a laser processing apparatus. FIG. 4 schematically illustrates by way of example in perspective the laser processing apparatus, denoted by 2, that is used to form peel-off layers in the wafer 11. In FIG. 4, X-axis directions, or leftward and rightward directions, indicated by the arrow X and Y-axis directions, or forward and rearward directions, indicated by the arrow Y extend perpendicularly to each other in a horizontal plane, and Z-axis directions, or upward and downward directions, indicated by an arrow Z extend vertically perpendicularly to the X-axis directions and the Y-axis directions.

As illustrated in FIG. 4, the laser processing apparatus 2 has a base 4 that supports various components thereof. A horizontal moving mechanism 6 is disposed on an upper surface of the base 4. The horizontal moving mechanism 6 has a pair of Y-axis guide rails 8 fixed to the upper surface of the base 4 and extending along the Y-axis directions.

The horizontal moving mechanism 6 also includes a Y-axis movable plate 10 slidably mounted on the Y-axis guide rails 8 for sliding movement therealong. A screw shaft 12 extending along the Y-axis directions is disposed between the Y-axis guide rails 8. An electric motor 14 for rotating the screw shaft 12 about its central axis is coupled to an end, i.e., a front end, of the screw shaft 12.

A nut, not illustrated, that contains a number of balls rollingly movable in a helical groove defined in the outer surface of the screw shaft 12 is operatively threaded over the screw shaft 12, thereby a ball screw is constructed. When the electric motor 14 is energized to rotate the screw shaft 12 about its central axis, the balls roll in the helical groove and circulate through the nut, causing the nut to move along one of the Y-axis directions at a time.

The nut is fixed to a lower surface of the Y-axis movable plate 10. Therefore, when the screw shaft 12 is rotated about its central axis by the electric motor 14, the nut and the Y-axis movable plate 10 are moved along one of the Y-axis directions at a time. A pair of X-axis guide rails 16 are fixed to an upper surface of the Y-axis movable plate 10 and extend along the X-axis directions.

An X-axis movable plate 18 is slidably mounted on the X-axis guide rails 16 for sliding movement therealong. A screw shaft 20 extending along the X-axis directions is disposed between the X-axis guide rails 16. An electric motor 22 for rotating the screw shaft 20 about its central axis is coupled to an end of the screw shaft 20.

A nut, not illustrated, that contains a number of balls rollingly movable in a helical groove defined in the outer surface of the screw shaft 20 is operatively threaded over the screw shaft 20, thereby a ball screw is constructed. When the electric motor 22 is energized to rotate the screw shaft 20 about its central axis, the balls roll in the helical groove and circulate through the nut, causing the nut to move along one of the X-axis directions at a time.

The nut is fixed to a lower surface of the X-axis movable plate 18. Therefore, when the screw shaft 20 is rotated about its central axis by the electric motor 22, the nut and the X-axis movable plate 18 are moved along one of the X-axis directions at a time.

A cylindrical table base 24 is rotatably disposed on an upper surface of the X-axis movable plate 18. A holding table 26 for holding thereon the laminated wafer referred to above is mounted on an upper portion of the table base 24. The holding table 26 has a circular upper surface as a holding surface lying parallel to the X-axis directions and the Y-axis directions, for example. The holding surface is provided by a porous plate 26a that is exposed upwardly.

The table base 24 has a lower portion coupled to a rotary actuator, not illustrated, such as an electric motor. When the rotary actuator is energized, it rotates the holding table 26 about its central axis extending along a straight line through the center of the holding surface parallel to the Z-axis directions. When the horizontal moving mechanism 6 is actuated, the holding table 26 is moved along the X-axis directions and/or the Y-axis directions.

The porous plate 26a is held in fluid communication with a suction source, not illustrated, such as a vacuum pump through a fluid channel, not illustrated, defined in the holding table 26. When the suction source is actuated, it generates a negative pressure that is transmitted through the fluid channel to a space near the holding surface.

A support structure 30 having a side surface generally parallel to the Y-axis directions and the Z-axis directions is disposed on a rear area of the base 4 behind the horizontal moving mechanism 6. A vertical moving mechanism 32 is disposed on the side surface of the support structure 30. The vertical moving mechanism 32 has a pair of Z-axis guide rails 34 fixed to the side surface of the support structure 30 and extending along the Z-axis directions.

The vertical moving mechanism 32 also includes a Z-axis movable plate 36 slidably mounted on the Z-axis guide rails 34 for sliding movement therealong. A screw shaft, not illustrated, extending along the Z-axis directions is disposed between the Z-axis guide rails 34. An electric motor 38 for rotating the screw shaft about its central axis is coupled to an end, i.e., an upper end, of the screw shaft.

A nut, not illustrated, that contains a number of balls rollingly movable in a helical groove defined in the outer surface of the screw shaft is operatively threaded over the screw shaft, thereby a ball screw is constructed. When the electric motor 38 is energized to rotate the screw shaft about its central axis, the balls roll in the helical groove and circulate through the nut, causing the nut to move along one of the Z-axis directions at a time.

The nut is fixed to a reverse side of the Z-axis movable plate 36. Therefore, when the screw shaft is rotated about its central axis by the electric motor 38, the nut and the Z-axis movable plate 36 are moved along one of the Z-axis directions at a time.

Figure 5:
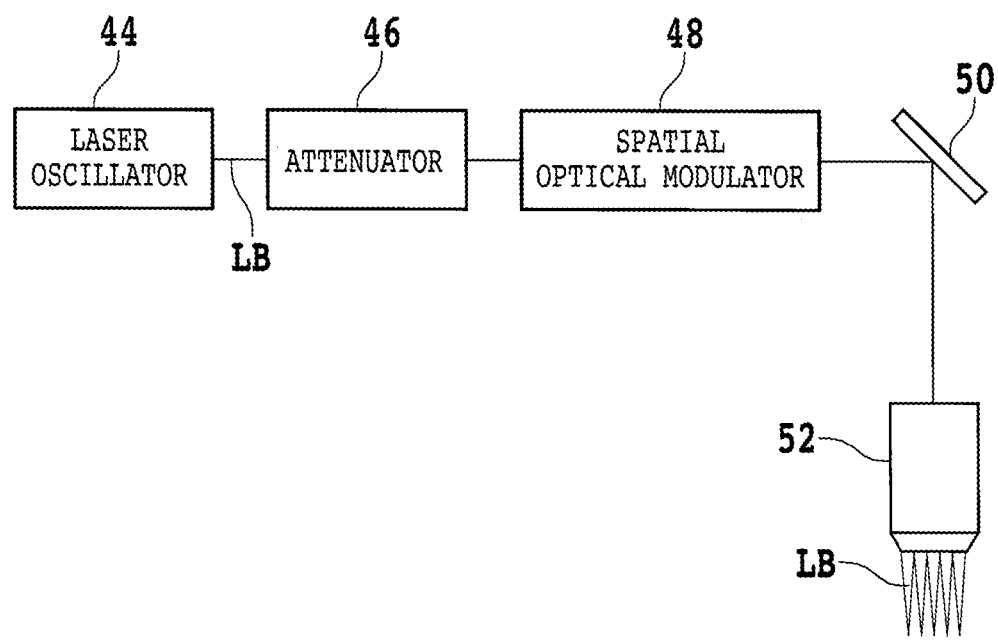
FIG. 5 is a view, partly in block form, schematically illustrating the manner in which a laser beam emitted from a laser beam applying unit travels.

A support block 40 is fixed to a face side of the Z-axis movable plate 36. The support block 40 supports a portion of a laser beam applying unit 42. FIG. 5 schematically illustrates, partly in block form, the manner in which a laser beam LB emitted from the laser beam applying unit 42 travels. Some of the components of the laser beam applying unit 42 are illustrated as functional blocks.

The laser beam applying unit 42 has a laser oscillator 44 mounted on the base 4. The laser oscillator 44 has Nd:YAG or the like as a laser medium and emits the laser beam LB that has a wavelength of 1342 nm, for example, transmittable through the wafer 11. The laser beam LB is a pulsed laser beam having a frequency of 60 kHz, for example.

The laser beam LB emitted from the laser oscillator 44 has its output power level adjusted by an attenuator 46 and is then supplied to a spatial optical modulator 48. The spatial optical modulator 48 branches the adjusted laser beam LB into a plurality of laser beams LB. Specifically, the spatial optical modulator 48 branches the laser beam LB whose output power level has been adjusted by the attenuator 46 into a plurality of laser beams LB having respective focused spots that will be positioned in the wafer 11 at different positions, i.e., coordinates, in a plane parallel to the X-axis directions and the Y-axis directions, i.e., an XY coordinate plane, and/or at different positions, i.e., heights, in the Z-axis directions, for example.

The laser beams LB emitted from the spatial optical modulator 48 are applied to and reflected by a mirror 50 to travel to an applying head 52. The applying head 52 houses therein a condensing lens, not illustrated, for converging the laser beams LB. The laser beams LB converged by the condensing lens are emitted toward the holding surface of the holding table 26.

As illustrated in FIG. 4, the applying head 52 is mounted on a front end of a cylindrical housing 54. The support block 40 is fixed to a rear side surface of the housing 54. An image capturing unit 56 is fixed to a front side surface of the housing 54.

The image capturing unit 56 includes an image capturing device including, for example, a light source such as a light-emitting diode (LED), an objective lens, a charge-coupled device (CCD) image sensor, or a complementary-metal-oxide-semiconductor (CMOS) image sensor, etc.

When the vertical moving mechanism 32 is actuated, the laser beam applying unit 42 and the image capturing unit 56 are moved along one of the Z-axis directions at a time. The components referred to above of the laser processing apparatus 2 are enclosed in a cover, not illustrated, mounted on the base 4. A touch panel 58 is disposed on a front surface of the cover.

The touch panel 58 includes an input device such as an electrostatic-capacitance or resistive-film touch sensor and a display device such as a liquid crystal display or an organic electroluminescence (EL) display. The touch panel 58 functions as a user interface.

The laser processing apparatus 2 forms peel-off layers in the wafer 11 according to the following sequence, for example. First, the laminated wafer is placed on the holding table 26 such that the center of the reverse side 17b of the support wafer 17 of the laminated wafer and the center of the holding surface of the holding table 26 are aligned with each other. Then, the suction source that is fluidly connected to the porous plate 26a is actuated to hold the laminated wafer under suction on the holding table 26.

Next, the image capturing unit 56 captures an image of the reverse side 11b of the wafer 11 of the laminated wafer. Then, on the basis of the captured image, the horizontal moving mechanism 6 is actuated to position the applying head 52 of the laser beam applying unit 42 directly above a region of the wafer 11 slightly radially inwardly of the outer circumferential region thereof.

On the basis of the captured image, the rotary actuator coupled to the lower portion of the table base 24 may be energized to make the crystal orientation [010] of monocrystalline silicon of the wafer 11 parallel to the X-axis directions and also to make the crystal orientation [001] thereof parallel to the Y-axis directions.

Thereafter, the laser beam applying unit 42 is energized to apply the branched laser beams LB from the applying head 52 to an annular first region of the wafer 11 that is positioned radially inwardly of the outer circumferential region thereof, thereby forming a first peel-off layer functioning as separation initiating points between the region of the wafer 11 where the devices 15 are formed and the outer circumferential region thereof (a first peel-off layer forming step S2 illustrated in FIG. 2).

Figure 6:
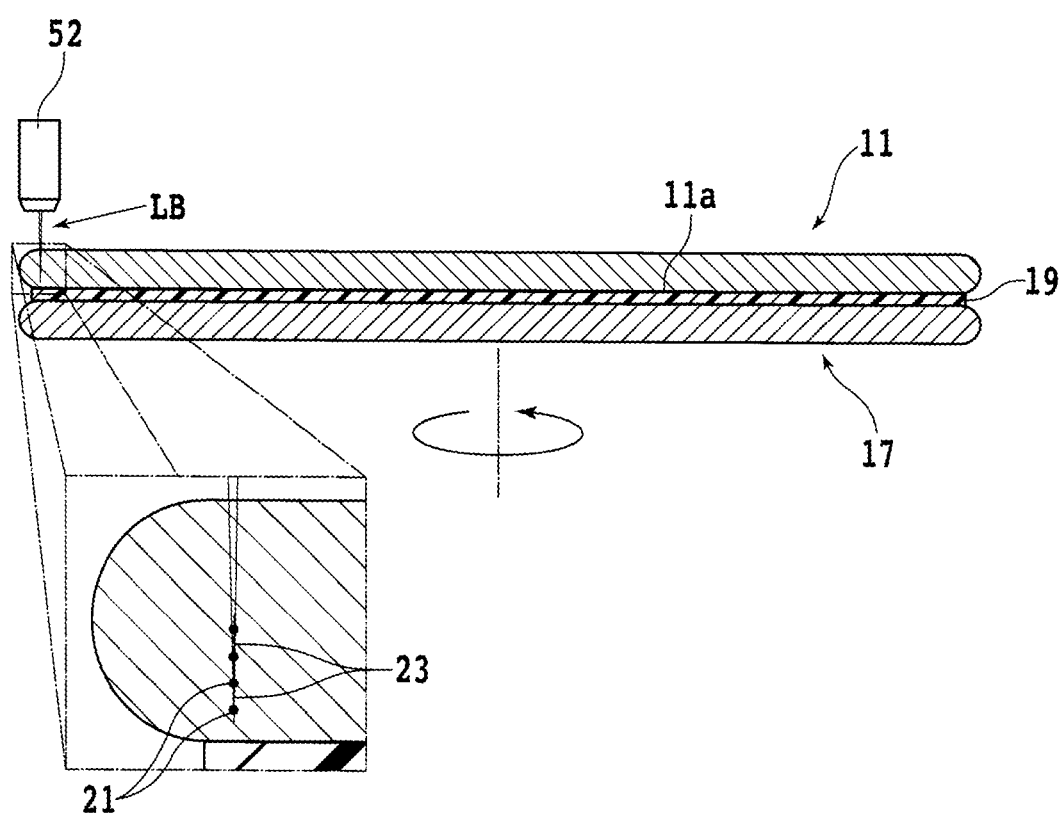
FIG. 6 is a side elevational view, partly in cross section, schematically illustrating the manner in which laser beams are applied to the wafer that is rotating.

In the first peel-off layer forming step S2, while the laser beams LB are being applied to the annular first region of the wafer 11 positioned radially inwardly of the outer circumferential region thereof, the holding table 26 that is holding the wafer 11 through the support wafer 17 interposed therebetween is rotated about its central axis. FIG. 6 schematically illustrates, in side elevation, partly in cross section, the manner in which the laser beams LB are applied to the wafer 11 that is rotating.

Specifically, in the first peel-off layer forming step S2, the laser beams LB branched such that they will form a plurality of, e.g., two to ten, respective focused spots at different positions in the Z-axis directions, i.e., heights, in the wafer 11 are applied to the wafer 11.

These focused spots include a lowest focused spot positioned at a height slightly higher than the face side 11a of the wafer 11 and a highest focused spot positioned at a height intermediate between the face and reverse sides 11a and 11b of the wafer 11. The focused spots are disposed at respective positions, i.e., heights, that are spaced at equal intervals, e.g., ranging from 5 to 15 μm, in the wafer 11 along the Z-axis directions.

The laser beams LB thus applied form modified areas 21 around the respective focused spots in the wafer 11 where the crystal structure of the material of the wafer 11 is disrupted and cracks 23 developed from each of the modified areas 21 so as to interconnect adjacent pairs of modified areas 21.

The modified areas 21 and the cracks 23 developed from the modified areas 21 jointly make up a peel-off layer in the wafer 11. Then, while the laser beams LB are being applied to the wafer 11, the rotary actuator coupled to the lower portion of the table base 24 is energized to cause the holding table 26 holding the laminated wafer to make one revolution about its central axis.

As a result, a peel-off layer, i.e., a first peel-off layer, is formed in the wafer 11 between the region of the wafer 11 where the devices 15 are formed and the outer circumferential region thereof. The first peel-off layer is of a hollow cylindrical shape along a side surface of a cylinder having a lower bottom surface positioned near the face side 11a of the wafer 11 and an upper bottom surface positioned within the wafer 11, for example.

Figure 7:
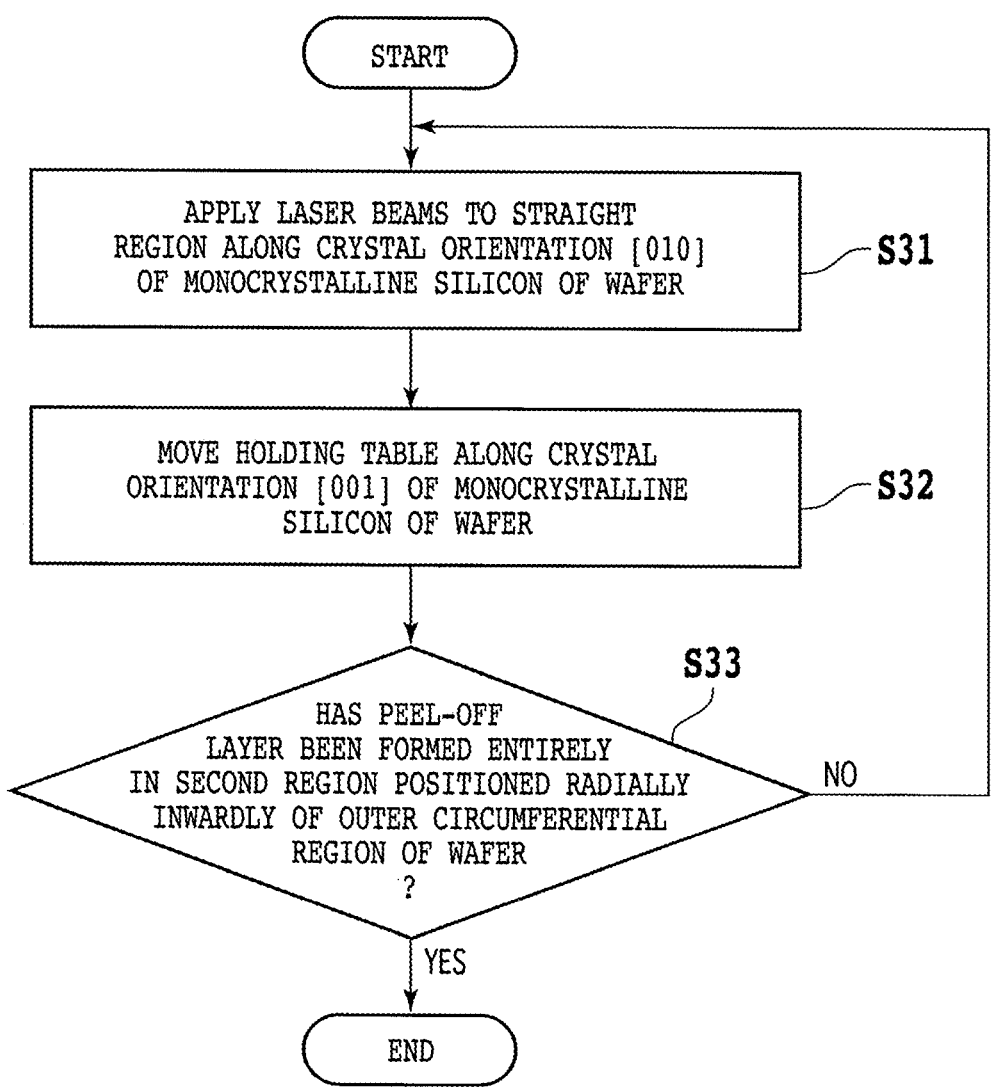
FIG. 7 is a flowchart schematically illustrating a second peel-off layer forming step by way of example.

Then, the laser beams LB are applied to a second region of the wafer 11 that is positioned radially inwardly of the outer circumferential region thereof, thereby forming a second peel-off layer functioning as separation initiating points between the face and reverse sides 11a and 11b of the wafer 11 (a second peel-off layer forming step S3 illustrated in FIG. 2). FIG. 7 is a flowchart schematically illustrating the second peel-off layer forming step S3 by way of example.

In the second peel-off layer forming step S3, the laser beams LB are applied to a straight region of the wafer 11 that extends along the crystal orientation [010] of monocrystalline silicon of the wafer 11 (a laser beam applying step S31 illustrated in FIG. 7). In a case where the laminated wafer is held on the holding table 26 such that the crystal orientation [010] lies parallel to the X-axis directions, for example, the laser beams LB are applied to the wafer 11 while the holding table 26 is being moved along one of the X-axis directions at a time.

Figure 8:
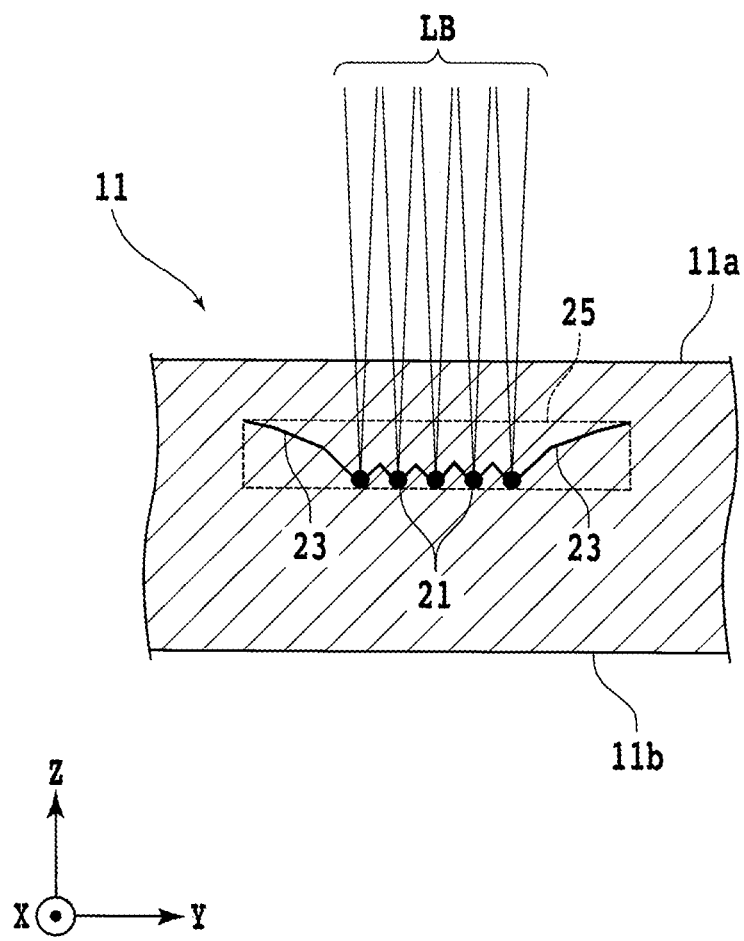
FIG. 8 is an enlarged fragmentary cross-sectional view schematically illustrating the manner in which laser beams are applied to the wafer that is moving along an X-axis direction.

FIG. 8 schematically illustrates, in side elevation, partly in cross section, the manner in which the laser beams LB are applied to the wafer 11 that is being moved along one of the X-axis directions at a time. In the laser beam applying step S31, the laser beams LB branched such that they will form a plurality of, e.g., two to ten, respective focused spots at different positions in the Y-axis directions, i.e., coordinates, in the wafer 11 are applied to the wafer 11.

These focused spots are positioned at the same height as the highest modified area 21 of those modified areas 21 included in the first peel-off layer described above. Furthermore, the focused spots are disposed at respective positions, i.e., coordinates, that are spaced at equal intervals, e.g., ranging from 5 to 15 μm, in the wafer 11 along the Y-axis directions.

In the second peel-off layer forming step S3, as with the first peel-off layer forming step S2, the laser beams LB thus applied form modified areas 21 and cracks 23 developed from each of the modified areas 21 in the wafer 11. Then, while the laser beams LB are being applied to the wafer 11, the horizontal moving mechanism 6 is actuated to move the holding table 26 holding the laminated wafer along one of the X-axis directions at a time.

As a result, a peel-off layer 25 is formed in a straight region along the X-axis directions that is included in the second region of the wafer 11 that is positioned radially inwardly of the outer circumferential region thereof. Many of the cracks 23 included in the peel-off layer 25 extend along a crystal plane (k01) (k represents an integral number except 0 whose absolute value is 10 or less). Specifically, when the laser beams LB are applied to the wafer 11 in the manner described above, the cracks 23 are likely to extend along the following crystal planes.

$$(101),(201),(301),(401),(501),(601),(701),(801),(901),(\underline{10}01) \quad [\text{Math. 1}]$$

$$(\bar{1}01),(\bar{2}01),(\bar{3}01),(\bar{4}01),(\bar{5}01,(\bar{6}01),(\bar{7}01),(\bar{8}01),(\bar{9}01),(\underline{\bar{10}}01) \quad [\text{Math. 2}]$$

The angle formed between the crystal plane (100) exposed on the face side and reverse sides 11a and 11b of the wafer 11 and the crystal plane (k01) is 45° or less. Therefore, if the direction in which the cracks 23 are developed is resolved into a component parallel to the face and reverse sides 11a and 11b of the wafer 11, i.e., a parallel component, and a component perpendicular to the face and reverse sides 11b of the wafer 11, i.e., a perpendicular component, then the parallel component becomes equal to or larger than the perpendicular component.

Then, the holding table 26 is moved along the crystal orientation [001] of monocrystalline silicon of the wafer 11 (an indexing feed step S32 illustrated in FIG. 7). For example, in a case where the laminated wafer is held on the holding table 26 such that the crystal orientation [001] of monocrystalline silicon of the wafer 11 lies parallel to the Y-axis directions, for example, the holding table 26 is moved along one of the Y-axis directions.

Figure 9:
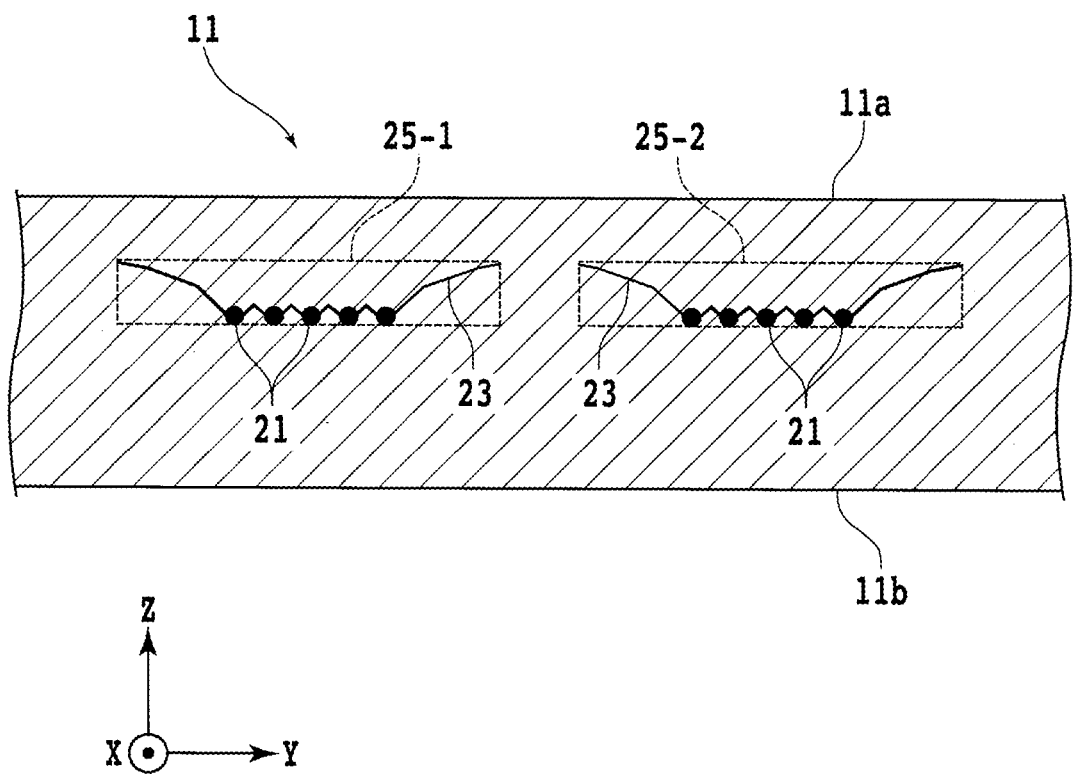
FIG. 9 is an enlarged fragmentary cross-sectional view schematically illustrating adjacent peel-off layers formed within the wafer.

Then, the laser beam applying unit 42 and the horizontal moving mechanism 6 are operated to form a peel-off layer 25 in a straight region in the wafer 11 that lies parallel to the straight region where the peel-off layer 25 has already been formed. In other words, the laser beam applying step S31 is performed again. FIG. 9 schematically illustrates, in cross section, adjacent peel-off layers 25 formed in the wafer 11 according to the laser beam applying step S31 performed two times.

In this case, the laser beams LB form a peel-off layer 25, i.e., a peel-off layer 25-2, in the wafer 11 that lies parallel to the peel-off layer 25, i.e., a peel-off layer 25-1, formed in a first cycle of the laser beam applying step S31, and spaced from the peel-off layer 25-1 in one of the Y-axis directions. Furthermore, the indexing feed step S32 and the laser beam applying step S31 are repeatedly carried out to form peel-off layers 25 entirely in the second region of the wafer 11 that is positioned radially inwardly of the outer circumferential region thereof, i.e., in the second region from one end to the other along the Y-axis directions.

If the peel-off layers 25 have been formed entirely in the second region of the wafer 11 that is positioned radially inwardly of the outer circumferential region thereof (a step S33 illustrated in FIG. 7: YES), then the second peel-off layer forming step S3 is completed. As a consequence, a peel-off layer, i.e., a second peel-off layer, is formed between the face and reverse sides 11a and 11b of the wafer 11. The second peel-off layer is of a disk shape extending along an upper bottom surface of a cylinder that has a side surface extending along the first peel-off layer describe above, for example.

According to the method illustrated in FIG. 2, after the first peel-off layer forming step S2 and the second peel-off layer forming step S3 have been carried out, external forces are exerted on the wafer 11 to separate the wafer 11 along the first peel-off layer and the second peel-off layer that function as separation initiating points (a separating step S4).

Figure 10A:
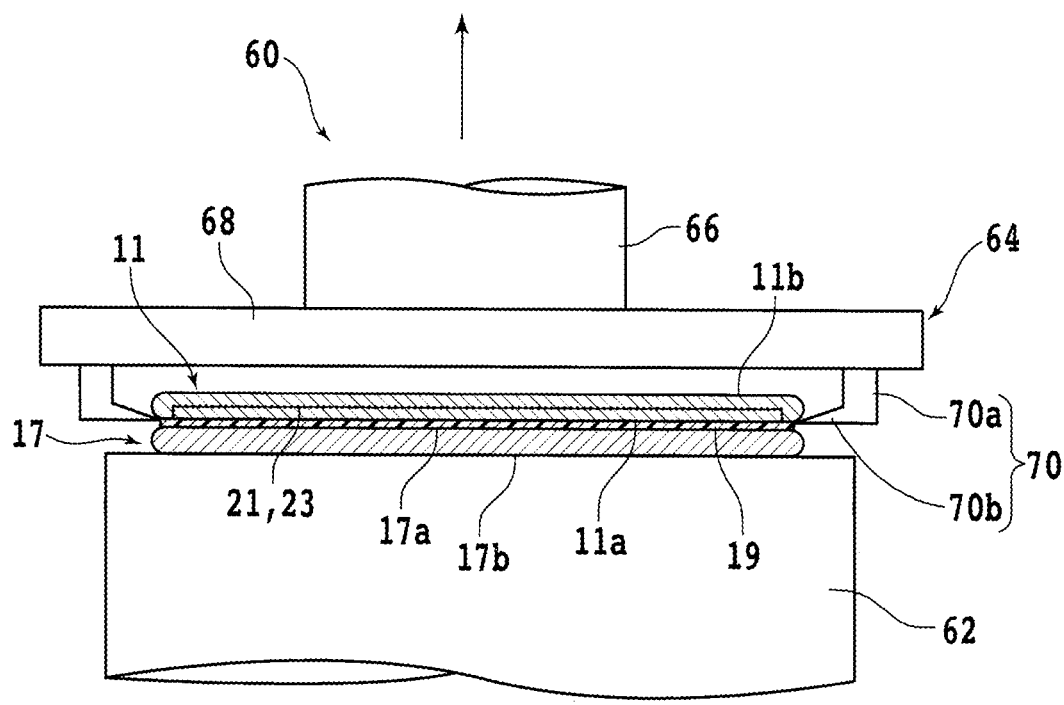
FIG. 10A is a side elevational view, partly in cross section, schematically illustrating the manner in which the wafer is separated.
Figure 10B:
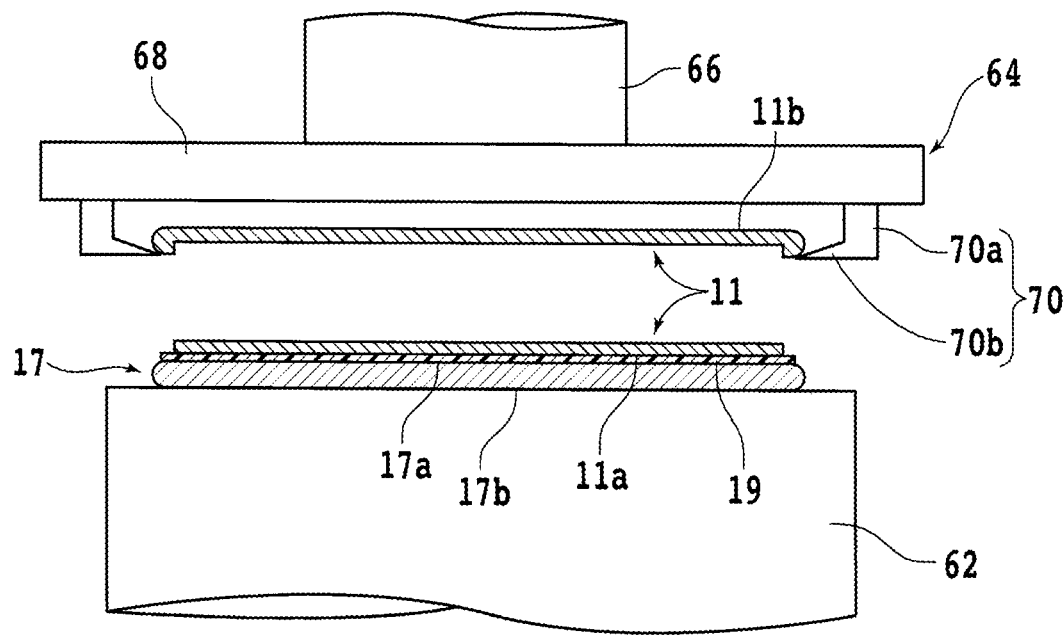
FIG. 10B is a side elevational view, partly in cross section, schematically illustrating the manner in which the wafer is separated.

FIGS. 10A and 10B each schematically illustrates, in side elevation, partly in cross section, the manner in which the wafer 11 is separated. The separating step S4 is carried out using a separating apparatus 60 illustrated in FIGS. 10A and 10B. As illustrated in FIGS. 10A and 10B, the separating apparatus 60 has a holding table 62 for holding thereon the laminated wafer including the wafer 11 in which the first peel-off layer and the second peel-off layer have been formed.

The holding table 62 has a circular upper surface as a holding surface that is provided by a porous plate, not illustrated, that is exposed upwardly. The porous plate is held in fluid communication with a suction source, not illustrated, such as a vacuum pump through a fluid channel, not illustrated, defined in the holding table 62. When the suction source is actuated, it generates a negative pressure that is transmitted through the fluid channel to a space near the holding surface.

The separating apparatus 60 also includes a separating unit 64 disposed above the holding table 62. The separating unit 64 has a cylindrical support rod 66 whose upper portion is coupled to a ball-screw-type lifting and lowering mechanism, not illustrated, for example. When the ball-screw-type lifting and lowering mechanism is actuated, it selectively lifts and lowers the separating unit 64.

The support rod 66 has a lower end fixed centrally to an upper portion of a disk-shaped grip claw base 68. A plurality of grip claws 70 that are spaced at generally equal intervals circumferentially around the grip claw base 68 are mounted on a lower surface of an outer circumferential region of the grip claw base 68. The grip claws 70 have respective plate-shaped vertical bars 70a extending downwardly.

The vertical bars 70a have respective upper end portions coupled to an actuator such as an air cylinder housed in the grip claw base 68. When the actuator is operated, it moves the grip claws 70 radially inwardly or outwardly of the grip claw base 68. The grip claws 70 also have respective plate-shaped claw points 70b extending from respective inner side surfaces of lower ends of the vertical bars 70a toward the center of the grip claw base 68. The claw points 70b are progressively thinner toward the center of the grip claw base 68.

The separating apparatus 60 carries out separating step S4 according to the following sequence, for example. First, the laminated wafer is placed on the holding table 62 such that the center of the reverse side 17b of the support wafer 17 of the laminated wafer that includes the wafer 11 where the first peel-off layer and the second peel-off layer have been formed and the center of the holding surface of the holding table 62 are aligned with each other.

Then, the suction source that is fluidly connected to the porous plate exposed as the holding surface is actuated to hold the laminated wafer under suction on the holding table 62. Next, the actuator housed in the grip claw base 68 is operated to position the grip claws 70 radially outwardly of the grip claw base 68.

Then, the lifting and lowering mechanism is actuated to position the tips of the claw points 70b of the respective grip claws 70 at the same height as the adhesive 19 of the laminated wafer. Next, the actuator in the grip claw base 68 is operated to bring the claw points 70b radially inwardly into contact with the laminated wafer. Thereafter, the lifting and lowering mechanism is actuated to lift the claw points 70b (see FIG. 10A).

The claw points 70b as they are lifted exert upward external forces on the outer circumferential region of the wafer 11, i.e., external forces along one of the thicknesswise directions of the wafer 11. Under the external forces thus exerted, the cracks 23 included in the first peel-off layer and/or the second peel-off layer are developed, separating the region of the wafer 11 where the devices are formed and the outer circumferential region thereof from each other and also separating a part of the wafer 11 belonging to the face side 11a and a part of the wafer 11 belonging to the reverse side 11b from each other (see FIG. 10B).

According to the method illustrated in FIG. 2, when the laser beams LB are applied to the wafer 11 fabricated such that the crystal plane (100) is exposed on each of the face and reverse sides 11a and 11b of the wafer 11, along the crystal orientation [010], a peel-off layer, i.e., a second peel-off layer, that functions as separation initiating points between the face and reverse sides 11a and 11b of the wafer 11 is formed in the wafer 11.

In this case, the cracks 23 extending from the modified areas 21 include many cracks 23 along the crystal plane (k01) (k represents an integral number except 0 whose absolute value is 10 or less). The acute angle formed between the crystal plane (100) and the crystal plane (k01) of the monocrystalline crystal is 45° or less. According to the method, therefore, the component of the direction in which the cracks 23 are developed that is parallel to the face and reverse sides 11a and 11b of the wafer 11, i.e., the parallel component, becomes equal to or larger than the component perpendicular to the face and reverse sides 11a and 11b of the wafer 11, i.e., the perpendicular component.

According to the method, therefore, the intervals between the adjacent modified areas 21 are increased. As a result, the distance that the holding table 26 is moved, i.e., an indexed distance, in the indexing feed step S32 is increased, thereby shortening the processing time, i.e., a period of time in which the laser beams LB are applied, required to form the peel-off layers 25 in the wafer 11 that function as separation initiating points between the face and reverse sides 11a and 11b of the wafer 11.

According to the method, moreover, cracks 23 are less likely to be developed from the peel-off layer 25 toward the face side 11a of the wafer 11. Consequently, the probability that devices 15 will be broken is lowered when the wafer 11 is separated into the part of the wafer 11 belonging to the face side 11a and the part of the wafer 11 belonging to the reverse side 11b.

The method described above represents an aspect of the present invention, and the present invention is not limited to the above method. According to the present invention, for example, after the first peel-off layer and the second peel-off layer have been formed in the wafer 11, the face side 11a of the wafer 11 may be affixed to the face side 17a of the support wafer 17. According to the present invention, in other words, the affixing step S1 may be carried out after the first peel-off layer forming step S2 and the second peel-off layer forming step S3.

Moreover, the structure of a laser processing apparatus that can be used in the present invention is not limited to the structure of the laser processing apparatus 2 described above. According to the present invention, for example, the present invention may be reduced to practice using a laser processing apparatus having a horizontal moving mechanism for moving the applying head 52 of the laser beam applying unit 42, etc. along the X-axis directions and/or the Y-axis directions.

According to the present invention, in other words, the holding table 26 for holding the laminated wafer including the wafer 11 and the applying head 52 of the laser beam applying unit 42 for emitting the laser beams LB may be relatively moved respectively along the X-axis directions and the Y-axis directions. There is no limitation on the structure for moving the holding table 26 and the applying head 52 in that manner.

According to the present invention, moreover, the first peel-off layer forming step S2 and the second peel-off layer forming step S3 may be carried out in any sequence. According to the present invention, in other words, the first peel-off layer forming step S2 may be carried out after the second peel-off layer forming step S3 has been carried out.

However, if the disk-shaped second peel-off layer is formed in the wafer 11 in the second peel-off layer forming step S3, then it may be impossible or difficult to newly form a peel-off layer in the wafer 11 in a region closer to the face side 11a of the wafer 11 than the second peel-off layer.

According to the present invention, therefore, it is preferable to carry out the second peel-off layer forming step S3 after the first peel-off layer forming step S2 has been carried out. This sequence makes it possible to form reliably in the wafer 11 a peel-off layer, i.e., a first peel-off layer, that functions as separation initiating points between the region of the wafer 11 where the devices 15 are formed and the outer circumferential region thereof.

According to the present invention, alternatively, it is preferable for the second region of the wafer where the second peel-off layer is formed to be positioned radially inwardly of the first region of the wafer 11 where the first peel-off layer is formed. The second region positioned radially inwardly of the first region allows the first peel-off layer to be formed reliably in the wafer 11 even if the first peel-off layer forming step S2 is carried out after the second peel-off layer forming step S3 has been carried out.

According to the present invention, in the first peel-off layer forming step S2, the first peel-off layer may be formed that functions as separation initiating points between the region of the wafer 11 where the devices 15 are formed and the outer circumferential region thereof. The first peel-off layer is not limited to any particular shape. For example, the first peel-off layer may be of a shape extending along a side surface of a cylinder having a lower bottom surface positioned near the face side 11a of the wafer 11 and an upper bottom surface positioned near the reverse side 11b of the wafer 11.

Specifically, the first peel-off layer may be formed in the wafer 11 so as to extend through the face and reverse sides 11a and 11b of the wafer 11. In a case where the first peel-off layer is of such a shape, the outer circumferential region of the wafer 11 may possibly be scattered around as offcuts in the separating step S4. In the first peel-off layer forming step S2 according to the present invention, therefore, the first peel-off layer should preferably be formed so as to terminate short of the reverse side 11b of the wafer 11.

Furthermore, the first peel-off layer may be of a shape extending along a side surface of a truncated cone having a lower bottom surface, i.e., a first bottom surface, positioned near the face side 11a of the wafer 11 and an upper bottom surface, i.e., a second bottom surface, positioned within the wafer 11 and smaller in diameter than the lower bottom surface. The first peel-off layer of such a shape may be formed by applying the laser beams LB to the wafer 11 such that their focused spots are progressively closer to the face side 11a of the wafer 11 toward the outer circumferential region thereof.

Figure 11:
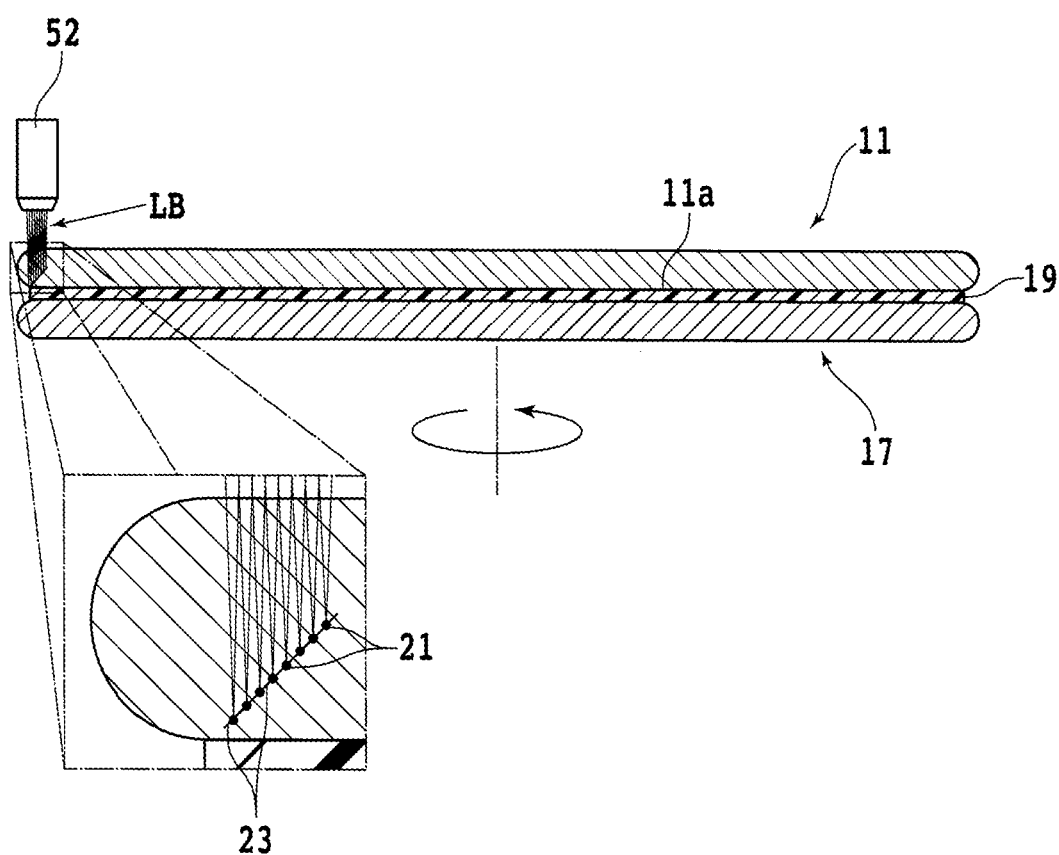
FIG. 11 is a side elevational view, partly in cross section, schematically illustrating the manner in which laser beams are applied to the wafer that is rotating.

FIG. 11 schematically illustrates, in side elevation, partly in cross section, the manner in which the laser beams LB are applied to the wafer 11 that is rotating in order to form first peel-off layer of such a shape. Specifically, for forming such a first peel-off layer, the laser beams LB are applied to the wafer 11 for forming a plurality of, e.g., eight, focused spots that are spaced at intervals of 10 μm in the wafer 11 in both radial directions thereof perpendicular to the Z-axis directions and thicknesswise directions thereof along the Z-axis directions.

The laser beams LB thus applied develop modified areas 21 around the respective focused spots in the wafer 11 where the crystal structure of the material of the wafer 11 is disrupted. The modified areas 21 are arranged in a straight array radially of the wafer 11 as viewed in plan. The straight array of the modified areas 21 is inclined to the face side 11a of the wafer 11 at an acute angle of 45°.

The angle formed between the straight array of the modified areas 21 and the face side 11a of the wafer 11 is not limited to 45°. Stated otherwise, the laser beams LB may be applied to the wafer 11 such that they develop their respective focused spots in the wafer 11 that are spaced at intervals in radial directions thereof and at intervals in thicknesswise directions thereof, the intervals in the radial directions being different from the intervals in the thicknesswise directions.

Cracks 23 extend from each of the modified areas 21 so as to interconnect adjacent modified areas 21 in each pair. The modified areas 21 and the cracks 23 extending from each of the modified areas 21 jointly form a peel-off layer in the wafer 11.

Then, while the laser beam applying unit 42 is being energized, the rotary actuator coupled to the lower portion of the table base 24 is operated to rotate the holding table 26 that is holding the laminated wafer thereon by at least one revolution.

As a result, a peel-off layer, i.e., a first peel-off layer, is formed in a first region of the wafer 11 that is positioned slightly radially inwardly of the outer circumferential region thereof, the first peel-off layer extending along a side surface of a truncated cone that has a lower bottom surface positioned near the face side 11a of the wafer 11 and an upper bottom surface positioned within the wafer 11.

When the first peel-off layer is thus formed, the probability that a side surface of the region where the devices 15 are formed that is newly exposed by dividing the wafer 11 on the separating apparatus 60 described above and an inner side surface of the outer circumferential region of the wafer 11 will contact each other is low. In this case, furthermore, cracks 23 tend to be developed in directions from the first peel-off layer along the side surface of the truncated cone.

In this case, moreover, the probability that cracks 23 will be developed toward devices 15 is low, preventing devices 15 from being broken. With the first peel-off layer thus formed, it is easy to fabricate chips from a region of the face side 11a of the wafer 11 near the outer circumferential region thereof. Therefore, the number of chips that can be fabricated from the wafer 11 is increased.

According to the present invention, in the first peel-off layer forming step S2, the laser beams LB may be applied to the wafer 11 while the horizontal moving mechanism 6 and the vertical moving mechanism 32 are being actuated in addition to or instead of the rotary actuator coupled to the lower portion of the table base 24. In other words, the laser beams LB may be applied to the wafer 11 while not only the wafer 11 is being rotated, but also the coordinates of the focused spots of the laser beams LB in the XY coordinate plane and the heights of the focused spots are being changed.

According to the present invention, in the first peel-off layer forming step S2, the laser beams LB may be applied to the wafer 11 in a plurality of cycles such that their focused spots are positioned at identical or close locations. In this case, the modified areas 21 included in the produced peel-off layer become larger in size and the cracks 23 included in the produced peel-off layer are extended further. Consequently, the wafer 11 can be separated more easily in the separating step S4.

According to the present invention, in the first peel-off layer forming step S2, the laser beams LB may be applied to the wafer 11 such that adjacent ones of the modified areas 21 are not interconnected by cracks 23 but interconnected directly. In this case, since the shape of the peel-off layer can be determined independently of the shape of the cracks 23 extending from the modified areas 21, the wafer 11 can be processed stably.

According to the present invention, in the second peel-off layer forming step S3, the region of the wafer 11 to which the laser beams LB are applied in the laser beam applying step S31 of the second peel-off layer forming step S3 is not limited to the straight region of the wafer 11 that extends along the crystal orientation
of monocrystalline silicon of the wafer 11. In the laser beam applying step S31, for example, the laser beams LB may be applied to a straight region that extends along the crystal orientation [001].

When the laser beams LB are applied to the wafer 11 in the manner described above, the cracks 23 are likely to extend along the following crystal planes.

$$(110),(210),(311),(410),(510),(610),(710),(810),(910),\\(10\underline{1}0) \quad [\text{Math. 3}]$$

$$(\bar{1}10),(\bar{2}10),(\bar{3}10),(\bar{4}10),(\bar{5}10),(\bar{6}10),(\bar{7}10),(\bar{8}10),(\bar{9}10),(\overline{10}10) \quad [\text{Math. 4}]$$

According to the present invention, furthermore, the laser beams LB may be applied to a straight region of the wafer 11 that extends along a direction slightly inclined to the crystal orientation [010] or the crystal orientation [001]. This alternative will be described below with reference to FIG. 12.

Figure 12:
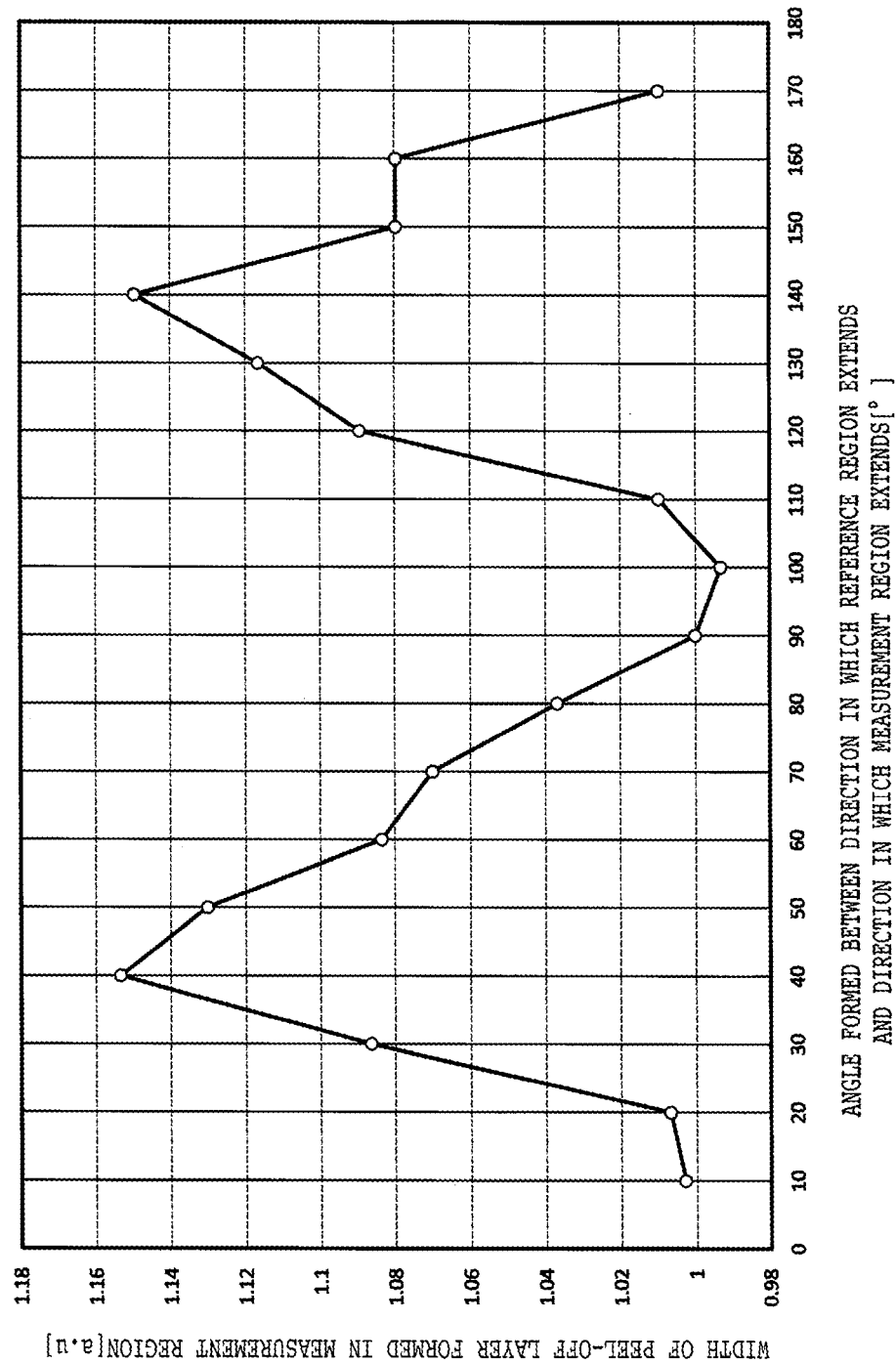
FIG. 12 is a graph illustrating widths of peel-off layers formed within the wafer when laser beams are applied to straight regions extending along respective different crystal orientations.

FIG. 12 is a graph illustrating the widths of peel-off layers formed within the wafer 11 when the laser beams LB are applied to straight regions extending along respective different crystal orientations, i.e., the lengths of the peel-off layers in a direction perpendicular to the direction along which the straight regions extend. The horizontal axis of the graph represents the angles, as viewed in plan, formed between the direction in which straight regions, i.e., reference regions, perpendicular to the crystal orientation [011] extend and straight regions, i.e., measurement regions, as measurement objects.

Specifically, in a case where the horizontal axis of the graph represents an angle of 45°, a straight region along the crystal orientation [001] becomes a measurement object. Similarly, in a case where the horizontal axis of the graph represents an angle of 135°, a straight region along the crystal orientation [010] becomes a measurement object. The vertical axis of the graph represents values obtained by dividing the widths of peel-off layers formed in measurement regions by applying the laser beams LB to the measurement regions by the widths of peel-off layers formed in reference regions by applying the laser beams LB to the reference regions.

As illustrated in FIG. 12, the widths of peel-off layers are wide when the angle formed between the direction in which the reference regions extend and the direction in which the measurement regions extend is in the range from 40° to 50° or from 130° to 140°. In other words, the widths of peel-off layers are wide when the laser beams LB are applied to not only straight regions along the crystal orientation [001] or the crystal orientation [010], but also straight regions along a direction inclined to these crystal orientations at an angle of 5° or less.

According to the present invention, consequently, in the laser beam applying step S31 of the second peel-off layer forming step S3, the laser beams LB may be applied to straight regions along a direction inclined at 5° or less, as viewed in plan, to the crystal orientation [001] or the crystal orientation [010].

In the laser beam applying step S31, more specifically, the laser beams LB may be applied to straight regions along a direction, i.e., a first direction, parallel to the crystal plane, i.e., the crystal plane (100), that is exposed on the face and reverse sides 11a and 11b of the wafer 11, among particular crystal planes included in the crystal planes {100} and inclined to a particular crystal orientation, i.e., the crystal orientation [001] or the crystal orientation [010], included in the crystal orientations <100> at an angle of 5° or less.

When the laser beam applying step S31 is carried out, the indexing feed step S32 is carried out by moving positions in the wafer 11 where the focused spots are formed by the applied laser beams LB along a direction, i.e., a second direction, parallel to the crystal plane, i.e., the crystal plane (100), that is exposed on the face and reverse sides 11a and 11b of the wafer 11, among particular crystal planes included in the crystal planes {100} and perpendicular to the first direction.

According to the present invention, moreover, in the second peel-off layer forming step S3, the laser beam applying step S31 and the indexing feed step S32 may be carried out repeatedly again after the peel-off layers 25 have been formed entirely in the second region of the wafer 11 that is positioned radially inwardly of the outer circumferential region thereof, i.e., in the second region from one end to the other along the Y-axis directions (step S33: YES).

Specifically, the laser beams LB for forming a peel-off layer 25 may be applied again to the second region of the wafer 11 where the peel-off layer 25 has already been formed. In this case, the densities of the modified areas 21 and the cracks 23 included in the peel-off layers 25 are increased. The increased densities make it easy to separate the wafer 11 in the separating step S4.

According to the present invention, in the second peel-off layer forming step S3, the laser beam applying step S31 may be carried out again after the laser beam applying step S31 and before the indexing feed step S32. In other words, the laser beams LB for forming a peel-off layer 25 may be applied again to the straight region where the peel-off layer 25 has already been formed. In this case, as is the case with the above alternative, it becomes easy to separate the wafer 11 in the separating step S4.

According to the present invention, in the separating step S4, ultrasonic waves may be applied to the wafer 11 prior to the separating of the wafer 11 in which the first peel-off layer and the second peel-off layer have been formed. In this case, inasmuch as the cracks 23 included in the first peel-off layer and the second peel-off layer are developed, the wafer 11 can be separated more easily.

According to the present invention, in the separating step S4, the wafer 11 may be separated using an apparatus other than the separating apparatus 60. For example, according to the present invention, in the separating step S4, after the region of the wafer 11 where the devices 15 are formed and the outer circumferential region thereof have been separated from each other, the wafer 11 may be separated into the part of the wafer 11 belonging to the face side 11a and the part of the wafer 11 belonging to the reverse side 11b.

Figure 13:
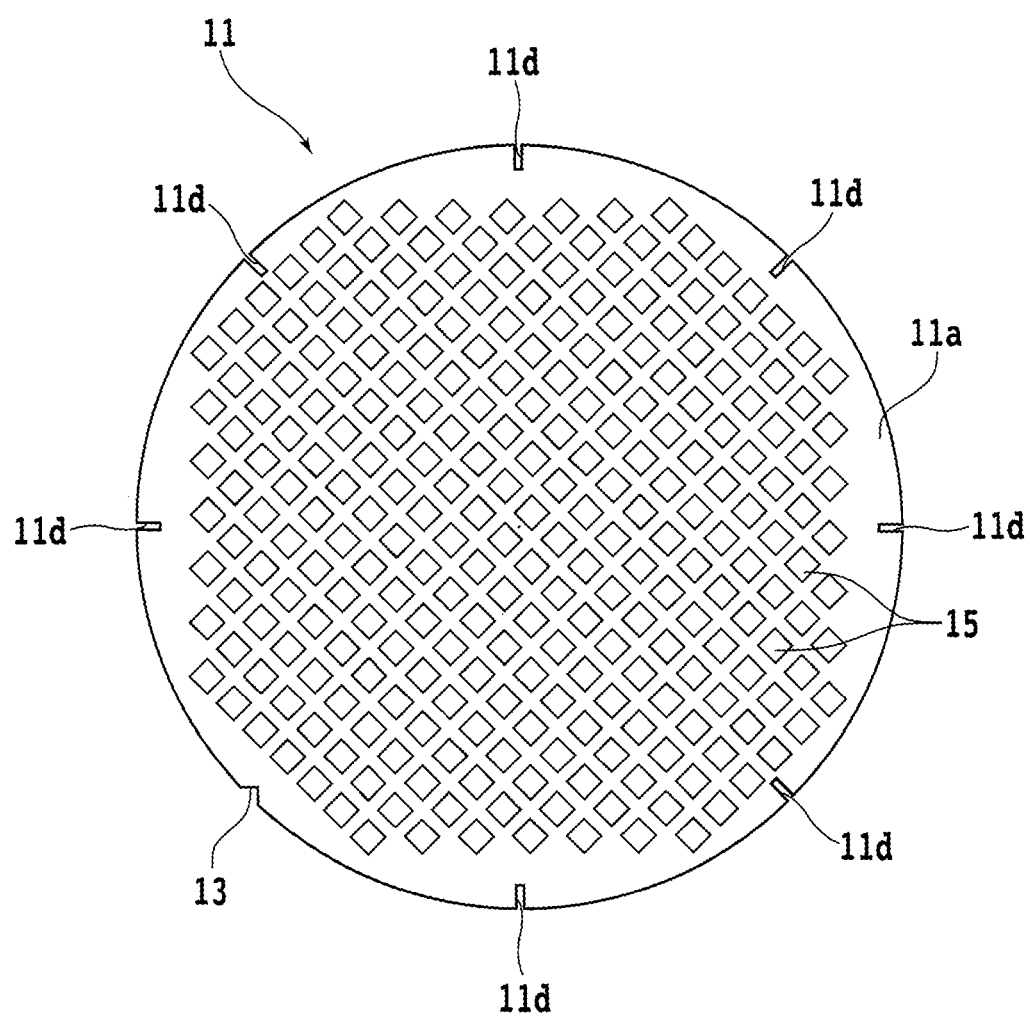
FIG. 13 is a plan view schematically illustrating a modified wafer.

An example of the separating step S4 described above will be described below with reference to FIGS. 13, 14A, 14B, 15A, and 15B. FIG. 13 schematically illustrates, in plan, a wafer 11 to be used in such the separating step S4. Prior to the affixing step S1 described above, a plurality of recesses 11d are formed in the outer circumferential region of the wafer 11, the recesses 11d extending radially of the wafer 11.

The recesses 11d are spaced at generally equal intervals circumferentially around the wafer 11, except where the notch 13 is defined. Each of the recesses 11d has a portion positioned radially inwardly of the wafer 11 and extending to the first peel-off layer to be formed in the first peel-off layer forming step S2.

The first peel-off layer formed in the wafer 11 is of a shape extending along a side surface of a cylinder having a lower bottom surface positioned near the face side 11a of the wafer 11 and an upper bottom surface positioned near the reverse side 11b of the wafer 11. Specifically, the first peel-off layer is formed in the wafer 11 so as to extend through the face and reverse sides 11a and 11b of the wafer 11.

The recesses 11d are formed by a known cutting apparatus when it cuts the wafer 11, for example. Alternatively, the recesses 11d may be formed by a known laser processing apparatus when it applies a laser beam to the wafer 11 for performing laser ablation.

The wafer 11 may alternatively have, rather than the recesses 11d, a plurality of peel-off layers defined in the outer circumferential region thereof and extending radially of the wafer 11. These peel-off layers are formed in the same process as the process of forming the first peel-off layers and the second peel-off layers described above, for example.

Figure 14A:
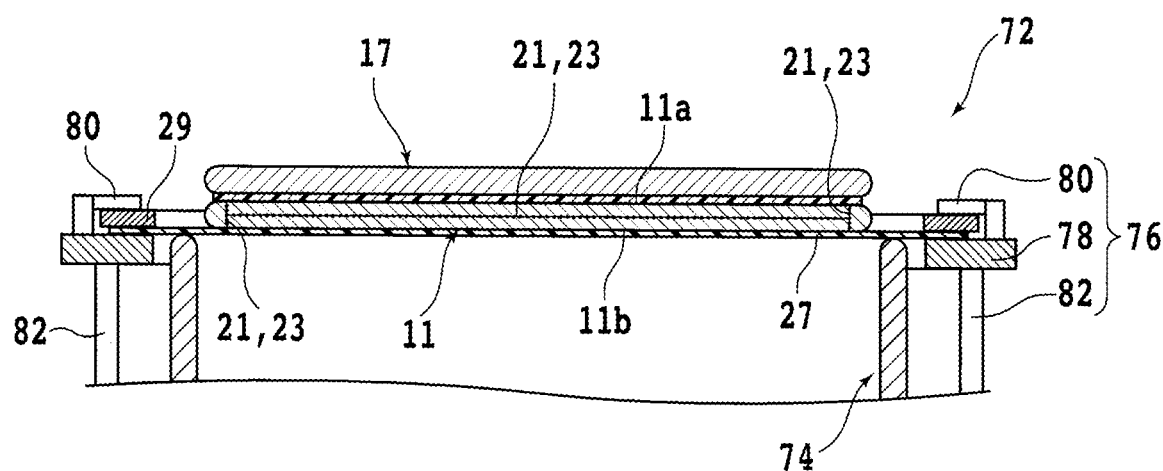
FIG. 14A is a side elevational view, partly in cross section, schematically illustrating the manner in which a region of a wafer where a plurality of devices are formed and an outer circumferential region of the wafer are separated from each other.
Figure 14B:
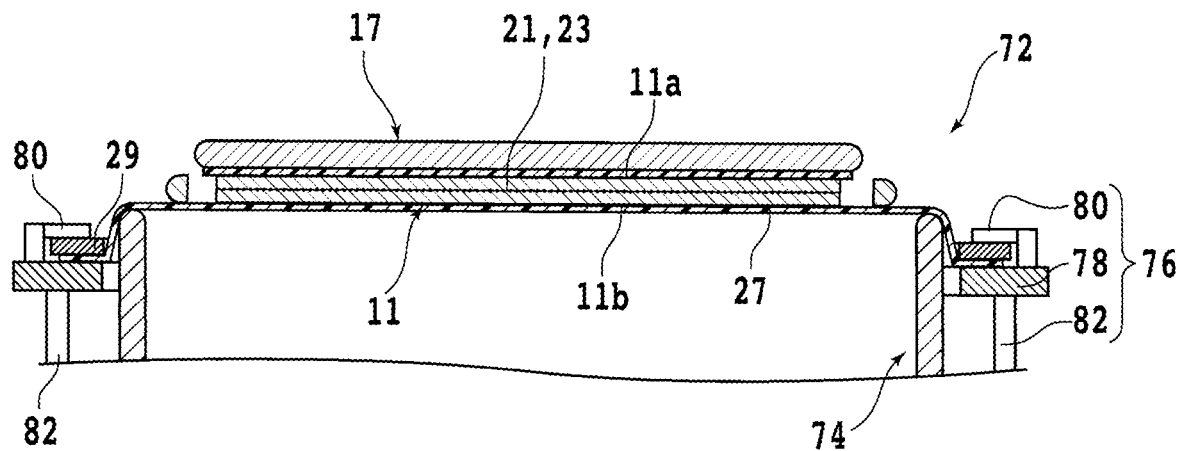
FIG. 14B is a side elevational view, partly in cross section, schematically illustrating the manner in which the region of the wafer where the plurality of devices are formed and the outer circumferential region of the wafer are separated from each other.

FIGS. 14A and 14B schematically illustrate in side elevation, partly in cross section, the manner in which the region of the wafer 11 illustrated in FIG. 13 where the devices 15 are formed and the outer circumferential region thereof are separated from each other. The wafer 11 is separated in this manner using an expanding apparatus 72 illustrated in FIGS. 14A and 14B.

The expanding apparatus 72 has a hollow cylindrical drum 74 that is fixed in position. A support unit 76 is disposed around the drum 74. The support unit 76 has an annular support base 78 surrounding an upper end portion of the drum 74. A plurality of clamps 80 are disposed on the support base 78 and spaced at generally equal intervals circumferentially around the support base 78.

A plurality of air cylinders are disposed beneath the support base 78 and spaced at generally equal intervals circumferentially around the support base 78. The air cylinders have respective piston rods 82 whose upper ends are fixed to a lower portion of the support base 78. Therefore, in the expanding apparatus 72, when the air cylinders are actuated, they selectively lift and lower the support base 78 and the clamps 80 with the piston rods 82.

For separating the region of the wafer 11 illustrated in FIG. 13 where the devices 15 are formed and the outer circumferential region thereof from each other, the annular frame 29 is affixed to a circumferential region of a surface of a disk-shaped expansion tape 27, and the reverse side 11b of the wafer 11 is affixed to a central region of the surface of the disk-shaped expansion tape 27. There is now formed a frame unit including the laminated wafer where the wafer 11 and the support wafer 17 are affixed to each other and the annular frame 29 integrally combined with the laminated wafer.

Then, the air cylinders are actuated to position an upper surface of the support base 78 flush with an upper end of the drum 74. Then, the annular frame 29 is placed on the support base 78 with the expansion tape 27 interposed therebetween. In other words, the frame unit with the support wafer 17 facing upwardly is placed on the support base 78.

Then, the annular frame 29 is fixed in position by the clamps 80 (see FIG. 14A). Then, the air cylinders are actuated to lower the annular frame 29 fixed in position by the clamps 80. The central region of the expansion tape 27 is expanded radially of the wafer 11 as much as the annular frame 29 is lowered.

At this time, forces directed radially outwardly of the wafer 11 act on the wafer 11 affixed to the expansion tape 27. As a result, the region of the wafer 11 where the devices 15 are formed and the outer circumferential region thereof are separated from each other along the first peel-off layer (see FIG. 14B).

Figure 15A:
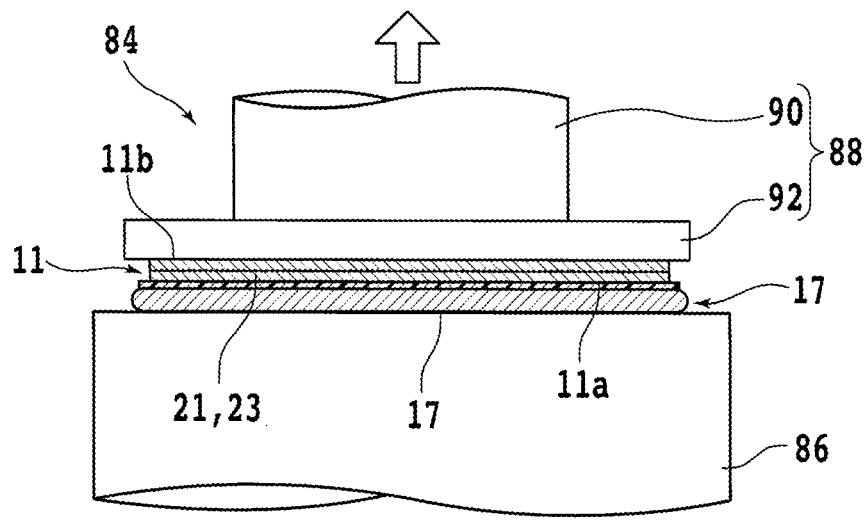
FIG. 15A is a side elevational view, partly in cross section, schematically illustrating the manner in which face and reverse sides of the wafer are separated from each other.
Figure 15B:
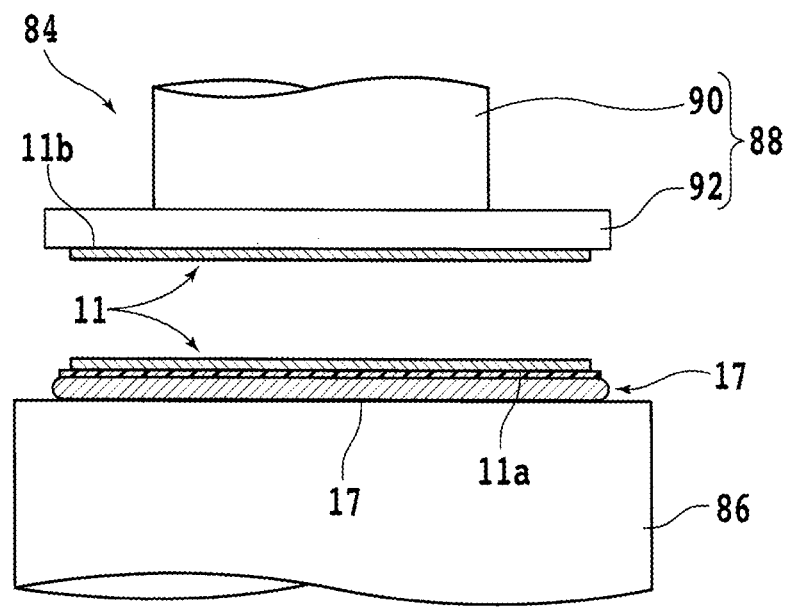
FIG. 15B is a side elevational view, partly in cross section, schematically illustrating the manner in which the face and reverse sides of the wafer are separated from each other.

FIGS. 15A and 15B schematically illustrate in side elevation, partly in cross section, the manner in which the part of the wafer 11 illustrated in FIG. 14B belonging to the face side 11a and the part of the wafer 11 belonging to the reverse side 11b are separated from each other. The wafer 11 is separated in this manner using a separating apparatus 84 illustrated in FIGS. 15A and 15B. The separating apparatus 84 has a holding table 86 for holding thereon the laminated wafer including the wafer 11 illustrated in FIG. 14B.

The holding table 86 has a circular upper surface as a holding surface that is provided by a porous plate, not illustrated, that is exposed upwardly. The porous plate is held in fluid communication with a suction source, not illustrated, such as a vacuum pump through a fluid channel, not illustrated, defined in the holding table 86. When the suction source is actuated, it generates a negative pressure that is transmitted through the fluid channel to a space near the holding surface.

The separating apparatus 84 also includes a separating unit 88 disposed above the holding table 86. The separating unit 88 has a cylindrical support rod 90 whose upper portion is coupled to a ball-screw-type lifting and lowering mechanism, not illustrated, for example. When the ball-screw-type lifting and lowering mechanism is actuated, it selectively lifts and lowers the separating unit 88.

The support rod 90 has a lower end fixed centrally to an upper portion of a disk-shaped suction plate 92. The suction plate 92 has a plurality of suction ports, not illustrated, defined in a lower surface thereof and held in fluid communication with a suction source, not illustrated, such as a vacuum pump through a fluid channel, not illustrated, defined in the suction plate 92. When the suction source is actuated, it generates a negative pressure that is transmitted through the fluid channel to a space near the lower surface of the suction plate 92.

For separating the part of the wafer 11 illustrated in FIG. 14B belonging to the face side 11a and the part of the wafer 11 belonging to the reverse side 11b from each other, the laminated wafer including the wafer 11 is removed the expansion tape 27. Then, the laminated wafer is placed on the holding table 86 such that the center of the reverse side 17b of the support wafer 17 of the laminated wafer and the center of the holding surface of the holding table 86 are aligned with each other.

Then, the suction source that is fluidly connected to the porous plate of the holding table 86 is actuated to hold the laminated wafer under suction on the holding table 86. Then, the lifting and lowering mechanism is actuated to lower the separating unit 88 to bring the lower surface of the suction plate 92 into contact with the reverse side 11b of the wafer 11.

Then, the suction source that is fluidly connected to the suction ports in the suction plate 92 is actuated to attract the reverse side 11b of the wafer 11 to the lower surface of the suction plate 92 under a negative pressure acting through the suction ports. Then, the lifting and lowering mechanism is actuated to lift the separating unit 88 to space the suction plate 92 away from the holding table 86 (see FIG. 15A).

At this time, forces directed upwardly thicknesswise of the wafer 11 act on the wafer 11 in which the reverse side 11b is held on the suction plate 92 by the negative pressure acting through the suction ports. As a result, the part of the wafer 11 belonging to the face side 11a and the part of the wafer 11 belonging to the reverse side 11b are separated from each other along the second peel-off layer functioning as separation initiating points (see FIG. 15B).

The structure, method, etc. according to the above embodiment may be changed or modified appropriately without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a monocrystalline silicon wafer fabricated such that a particular crystal plane included in crystal planes {100} is exposed on each of face and reverse sides of the monocrystalline silicon wafer, having a plurality of devices formed on the face side, and having a beveled outer circumferential region, by applying a laser beam having a wavelength transmittable through the monocrystalline silicon wafer while positioning a focused spot of the laser beam within the monocrystalline silicon wafer, thereby forming a peel-off layer within the monocrystalline silicon wafer, and thereafter separating the monocrystalline silicon wafer along the peel-off layer that functions as separation initiating points, the method comprising:

an affixing step of affixing the face side of the monocrystalline silicon wafer to a face side of a support wafer;

a first peel-off layer forming step of applying the laser beam from the reverse side of the monocrystalline silicon wafer to an annular first region of the monocrystalline silicon wafer that is positioned radially inwardly of the outer circumferential region of the monocrystalline silicon wafer, thereby forming a first peel-off layer that functions as separation initiating points between a region of the monocrystalline silicon wafer where the devices are formed and the outer circumferential region thereof;

a second peel-off layer forming step of applying the laser beam from the reverse side of the monocrystalline silicon wafer to a second region of the monocrystalline silicon wafer that is positioned radially inwardly of the outer circumferential region of the monocrystalline silicon wafer, thereby forming a second peel-off layer that functions as separation initiating points between a part of the monocrystalline silicon wafer that belongs to the face side thereof and a part of the monocrystalline silicon wafer that belongs to the reverse side thereof; and a separating step of, after the affixing step, the first peel-off layer forming step and the second peel-off layer forming step, exerting external forces on the monocrystalline silicon wafer, thereby separating the monocrystalline silicon wafer along the first peel-off layer and the second peel-off layer as the separation initiating points, wherein the second peel-off layer forming step includes
a laser beam applying step of applying the laser beam to a straight region of the monocrystalline silicon wafer along a first direction included in the second region while moving the monocrystalline silicon wafer and the focused spot relatively to each other along the first direction that lies parallel to the particular crystal plane and is inclined to a particular crystal orientation included in crystal orientations <100> at an angle of 5° or less, and an indexing feed step of moving a position in the monocrystalline crystal wafer where the focused spot is formed by the applied laser beam along a second direction parallel to the particular crystal plane and perpendicular to the first direction, and the laser beam applying step and the indexing feed step are repeatedly carried out to form the second peel-off layer.

2. The method according to claim 1, wherein the first peel-off layer forming step is carried out before the second peel-off layer forming step.

3. The method according to claim 1, wherein the second region is positioned radially inwardly of the first region.

4. The method according to claim 1, wherein the first peel-off layer forming step includes the step of forming the first peel-off layer so as to terminate short of the reverse side of the monocrystalline crystal wafer.

5. The method according to claim 1, wherein the first peel-off layer forming step includes the step of forming the first peel-off layer along a side surface of a truncated cone having a first bottom surface positioned near the face side of the monocrystalline crystal wafer and a second bottom surface smaller in diameter than the first bottom surface and positioned within the monocrystalline crystal wafer, by applying the laser beam such that the focused spot thereof is progressively closer to the face side of the monocrystalline crystal wafer toward the outer circumferential region thereof.

* * * * *